(12) United States Patent
Nguyen et al.

(10) Patent No.: US 10,256,535 B2
(45) Date of Patent: Apr. 9, 2019

(54) SELECTIVELY SHIELDING RADIO FREQUENCY MODULE WITH MULTI-LAYER ANTENNA

(71) Applicant: Skyworks Solutions, Inc., Woburn, MA (US)

(72) Inventors: Hoang Mong Nguyen, Fountain Valley, CA (US); Anthony James LoBianco, Irvine, CA (US); Gregory Edward Babcock, Ottawa (CA); Darren Roger Frenette, Pakenham (CA); George Khoury, Ottawa (CA); René Rodriguez, Rancho Santa Margarita, CA (US)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

(21) Appl. No.: 15/490,436

(22) Filed: Apr. 18, 2017

(65) Prior Publication Data

US 2017/0301986 A1    Oct. 19, 2017

Related U.S. Application Data

(60) Provisional application No. 62/324,768, filed on Apr. 19, 2016, provisional application No. 62/324,750, filed on Apr. 19, 2016.

(51) Int. Cl.
*H01Q 1/52*   (2006.01)
*H01Q 1/22*   (2006.01)
(Continued)

(52) U.S. Cl.
CPC ........... *H01Q 1/526* (2013.01); *H01L 21/027* (2013.01); *H01L 21/268* (2013.01);
(Continued)

(58) Field of Classification Search
CPC ............ H01Q 1/526; H01Q 1/52; H01Q 1/38; H01Q 1/2291; H01Q 1/22; H01L 23/498;
(Continued)

(56) References Cited

U.S. PATENT DOCUMENTS 6,392,603 B1   5/2002   Kurz et al.
6,686,649 B1   2/2004   Mathews et al.
(Continued)

OTHER PUBLICATIONS

International Search Report dated Aug. 18, 2017 for International Application No. PCT/US2017/028209 filed Apr. 18, 2017, 3 pages.
(Continued)

*Primary Examiner* — Jean B Jeanglaude
(74) *Attorney, Agent, or Firm* — Knobbe Martens Olson & Bear LLP

(57) ABSTRACT

Selectively shielded radio frequency modules are disclosed. A radio frequency module can include a package substrate, a radio frequency component on the package substrate, a multi-layer antenna, a radio frequency shielding structure configured to provide shielding between the multi-layer antenna and the radio frequency component. The radio frequency shielding structure can include a shielding layer providing a shield over the radio frequency component and leaving the radio frequency module unshielded over the antenna.

20 Claims, 21 Drawing Sheets

(51) Int. Cl.
| | |
|---|---|
| H01Q 1/38 | (2006.01) |
| H01L 21/027 | (2006.01) |
| H01L 21/268 | (2006.01) |
| H01L 21/285 | (2006.01) |
| H01L 21/3205 | (2006.01) |
| H01L 21/78 | (2006.01) |
| H01L 23/498 | (2006.01) |
| H01L 23/552 | (2006.01) |
| H01L 23/66 | (2006.01) |
| H01L 23/00 | (2006.01) |

(52) U.S. Cl.
CPC .... *H01L 21/2855* (2013.01); *H01L 21/28568* (2013.01); *H01L 21/32051* (2013.01); *H01L 21/78* (2013.01); *H01L 23/498* (2013.01); *H01L 23/552* (2013.01); *H01L 23/66* (2013.01); *H01L 24/48* (2013.01); *H01Q 1/2283* (2013.01); *H01Q 1/2291* (2013.01); *H01Q 1/38* (2013.01); *H01L 2223/6611* (2013.01); *H01L 2223/6644* (2013.01); *H01L 2223/6677* (2013.01); *H01L 2224/48091* (2013.01); *H01L 2924/01022* (2013.01); *H01L 2924/01029* (2013.01); *H01L 2924/1421* (2013.01)

(58) Field of Classification Search
CPC . H01L 21/027; H01L 21/268; H01L 21/2855; H01L 21/285; H01L 21/28568; H01L 21/28
USPC .................................. 343/893, 700 MS, 841
See application file for complete search history.

(56) References Cited

U.S. PATENT DOCUMENTS

| | | | |
|---|---|---|---|
| 6,744,213 B2* | 6/2004 | Wilcoxson | H01J 37/321 315/111.21 |
| 6,850,196 B2 | 2/2005 | Wong et al. | |
| 6,861,731 B2 | 3/2005 | Buijsman et al. | |
| 8,125,788 B2 | 2/2012 | Hatanaka et al. | |
| 8,199,518 B1 | 6/2012 | Chun et al. | |
| 8,410,990 B2 | 4/2013 | Kazanchian | |
| 2004/0252064 A1 | 12/2004 | Yuanzhu | |
| 2007/0164907 A1 | 7/2007 | Gaucher et al. | |
| 2008/0291115 A1* | 11/2008 | Doan | H01Q 1/38 343/893 |
| 2009/0295645 A1* | 12/2009 | Campero | H01Q 1/38 343/700 MS |
| 2010/0103058 A1 | 4/2010 | Kato et al. | |
| 2011/0084378 A1 | 4/2011 | Welch et al. | |
| 2011/0273360 A1* | 11/2011 | Campero | H01Q 1/2216 343/893 |
| 2012/0092220 A1 | 4/2012 | Tani et al. | |
| 2012/0313821 A1 | 12/2012 | Fischer | |
| 2013/0093629 A1 | 4/2013 | Chiu et al. | |
| 2013/0334321 A1 | 12/2013 | Kato et al. | |
| 2014/0175621 A1 | 6/2014 | Chen et al. | |
| 2014/0225795 A1 | 8/2014 | Ya | |
| 2014/0252595 A1 | 9/2014 | Yen et al. | |
| 2014/0253382 A1 | 9/2014 | Markish et al. | |
| 2015/0222012 A1 | 8/2015 | Van Zeijl et al. | |
| 2015/0263421 A1 | 9/2015 | Chiu et al. | |
| 2015/0364429 A1 | 12/2015 | Lee et al. | |
| 2016/0064337 A1 | 3/2016 | Chen et al. | |
| 2016/0149300 A1 | 5/2016 | Ito et al. | |
| 2017/0301630 A1 | 10/2017 | Nguyen et al. | |
| 2017/0301985 A1 | 10/2017 | Nguyen et al. | |

OTHER PUBLICATIONS

Written Opinion dated Aug. 18, 2017 for International Application No. PCT/US2017/028209 filed Apr. 18, 2017, 16 pages.
Amkor, System in Package (SIP) Technology Solutions Data Sheet, Rev. Nov. 2015, 4 pages, available at https://amkor.com/index.cfm?objectid=0538A98A-A85E-0A85-F5EF006A6CEEEC13 (accessed on May 24, 2017).
Brown, et al, Trends in RF/Wireless Packaging An Overview, 2004, 98 pages, available at: http://www.iwpc.org/Presentations/IWPC_Trends_Packaging_Final_slides_MTT_S_2004.pdf (accessed on May 3, 2017).
Insight SIP, "Application Note AN160601 Use of ISP 1507 Development Kit," Oct. 27, 2016, available at: http://www.insightsip.com/fichiers_insightsip/pdf/bie/ISP1507/isp_ble_AN160601.pdf (accessed: Jul. 24, 2017).
Insight SiP, "ISP 1507 High Performance Bluetooth 5 Ready, NFC & ANT Low Energy Module with MCU & Antenna," Jan. 16, 2017, available at: http://www.insightsip.com/fichiers_insightsip/pdf/ble/ISP1507/isp_ble_DS1507.pdf (accessed: Jul. 24, 2017).
Murata Electronics, "SN8000/SN800UFL Wi-Fi Module: Data Sheet," Version 1.0, Nov. 25, 2013, available at: http://www.mouser.com/pdfdocs/sn80008000ufl_ds_112513.PDF (accessed: Jul. 24, 2017).
Murata Electronics, "SN820X Wi-Fi Network Controller Module Family: User Manual," Version 2.2, Mar. 3, 2014, available at: http://www.mouser.com/pdfdocs/sn820x_manual_030314.PDF (accessed: Jul. 24, 2017).
Murata Electronics, "Bluetooth Low Energy Module Data Sheet," Rev. J, Feb. 27, 2015, available at: http://wireless murata.com/eng/products/rf-modules-1/bluetooth/type-zy.html PDF (accessed: Jul. 24, 2017).
U.S. Appl. No. 15/490,346, Selective Shielding of Radio Frequency Modules, filed Apr. 18, 2017.
U.S. Appl. No. 15/490,349, Methods for Selectively Shielding Radio Frequency Modules, filed Apr. 18, 2017.

* cited by examiner

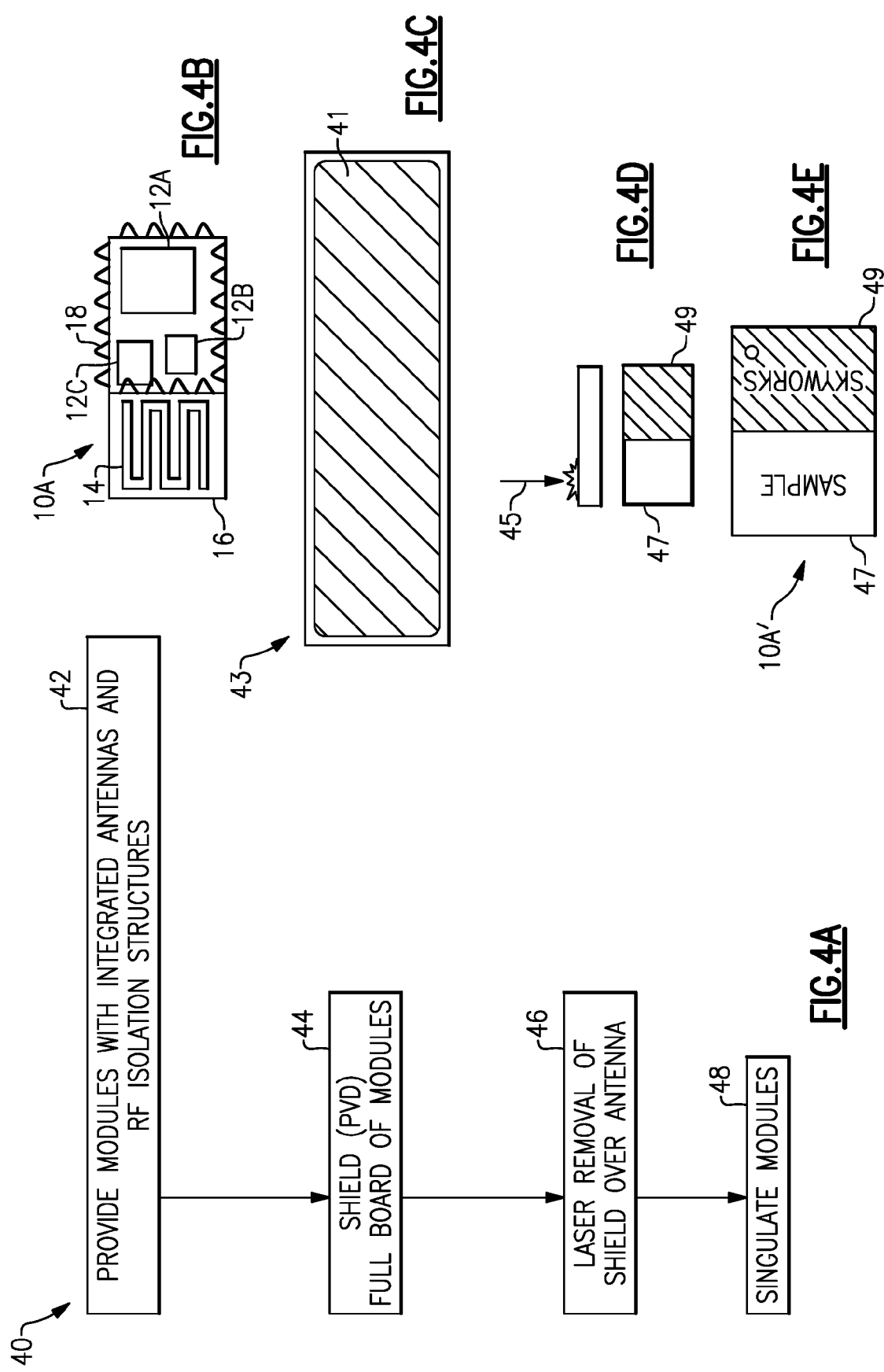

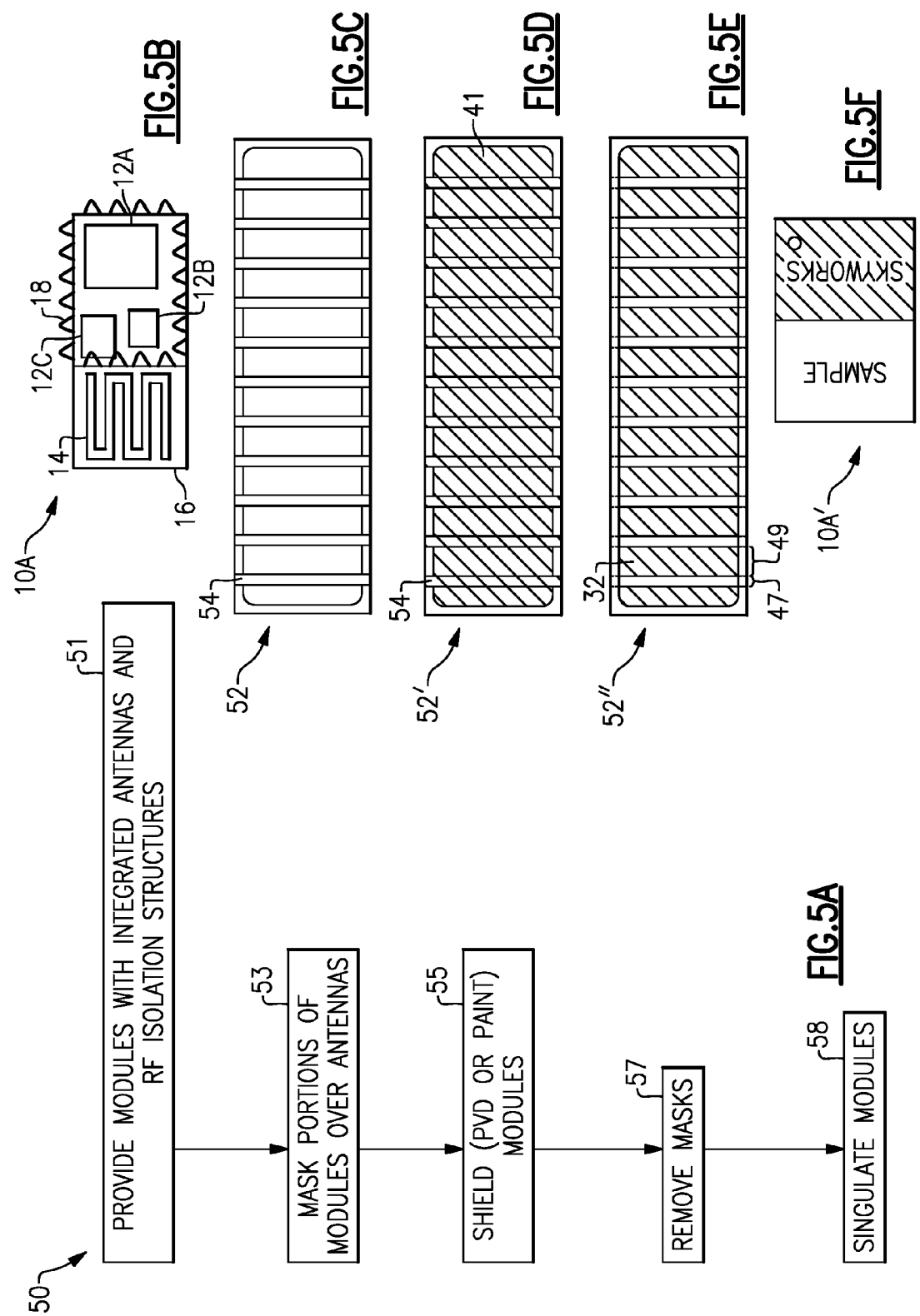

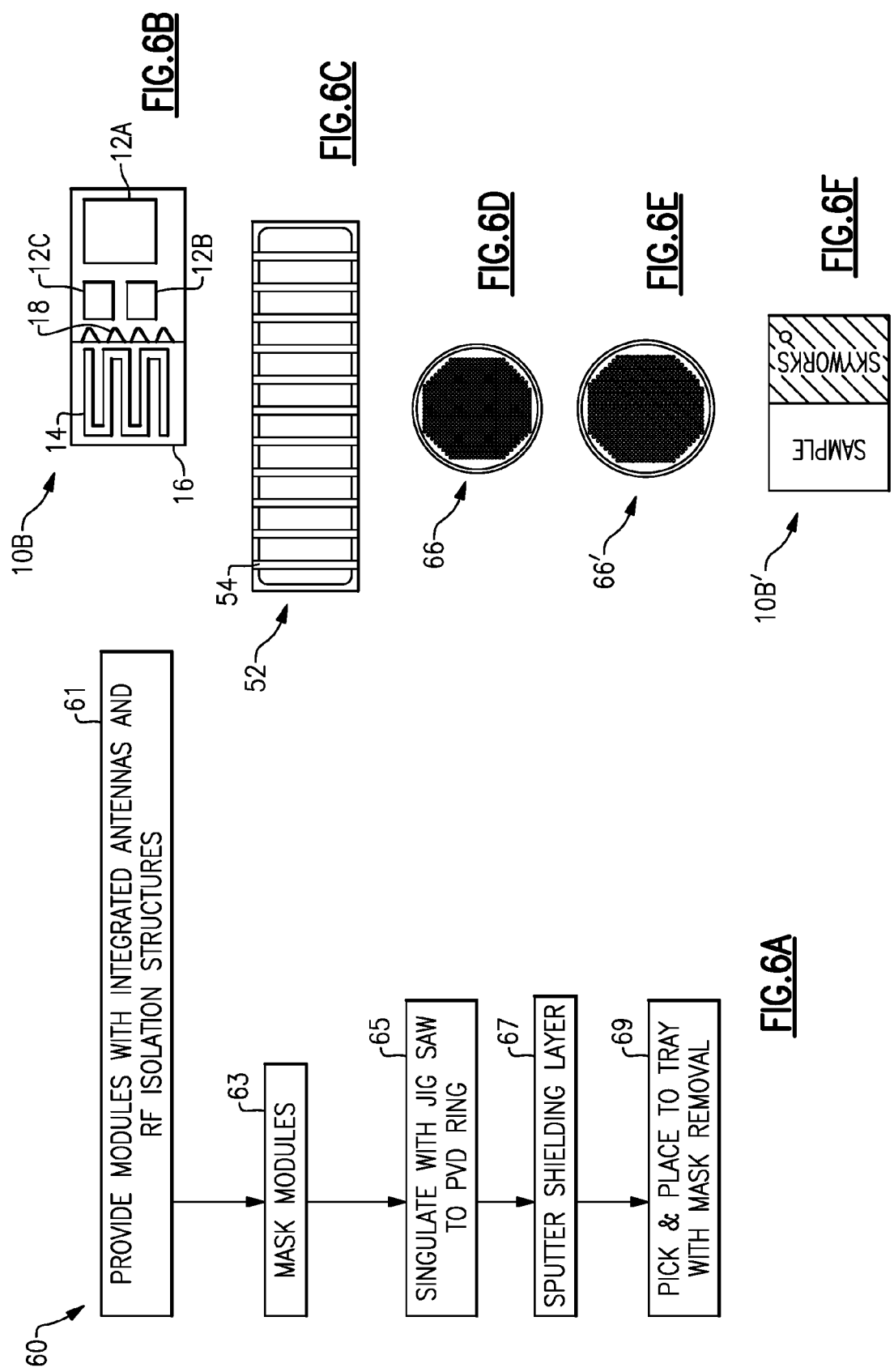

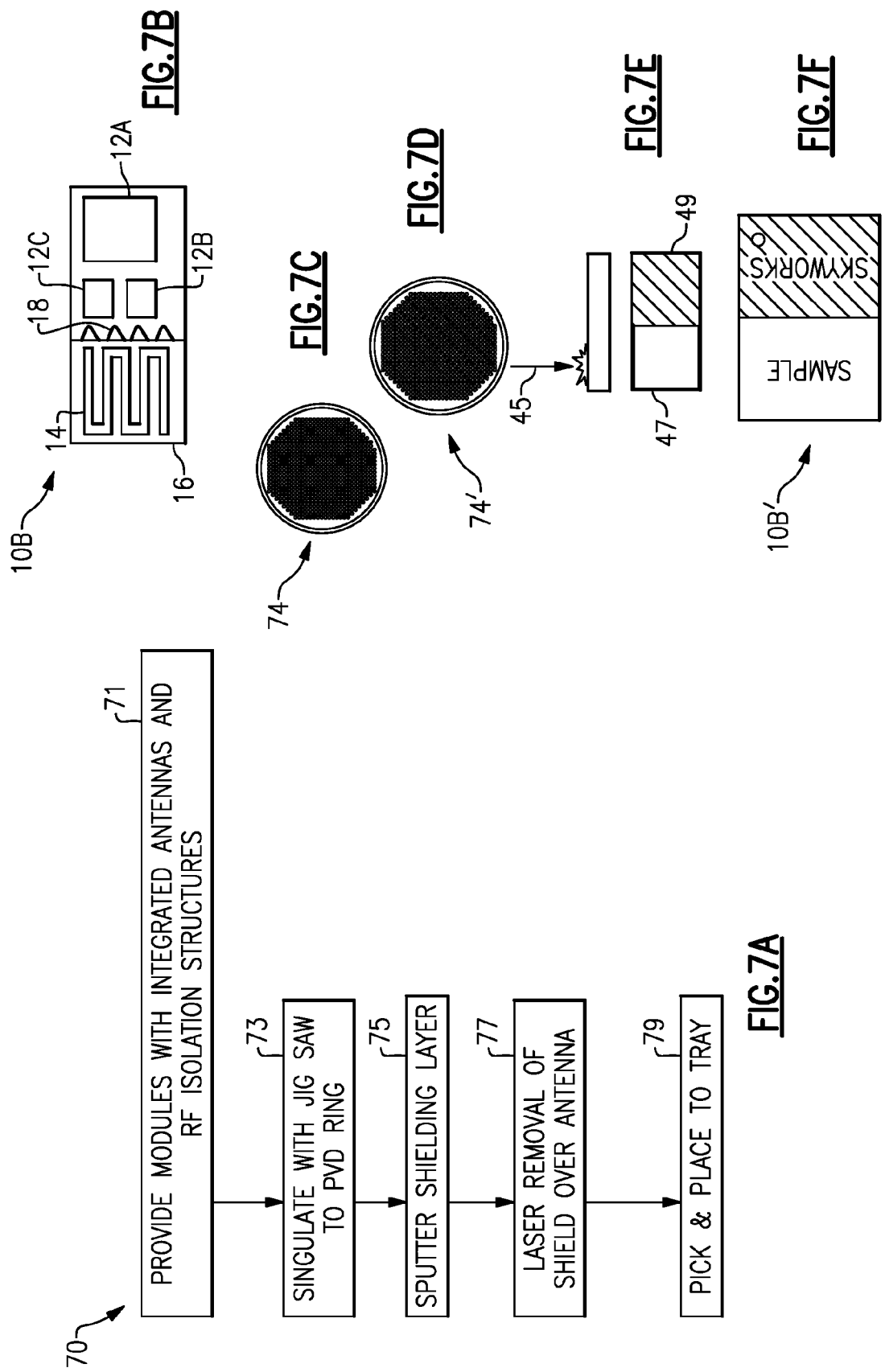

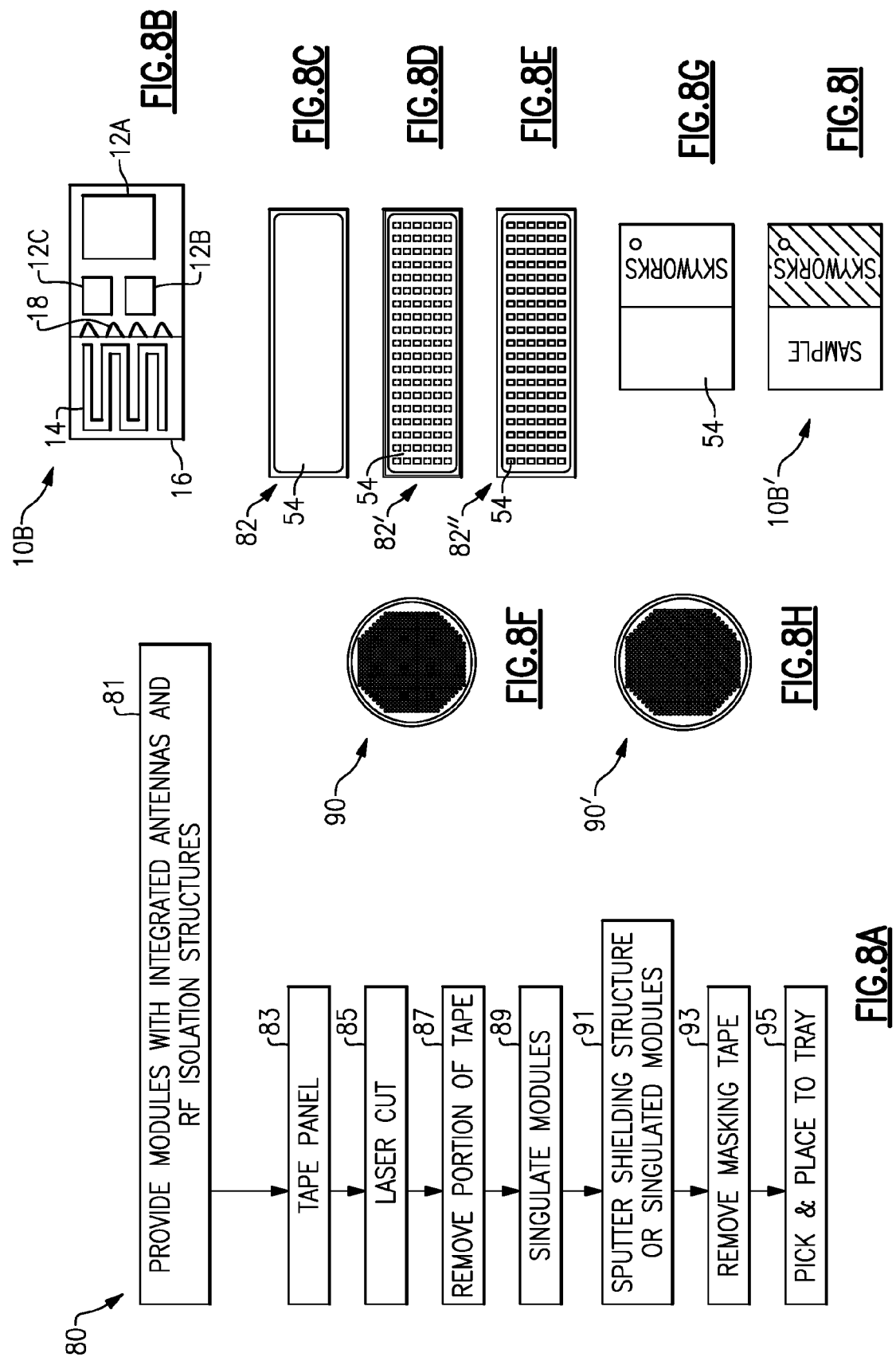

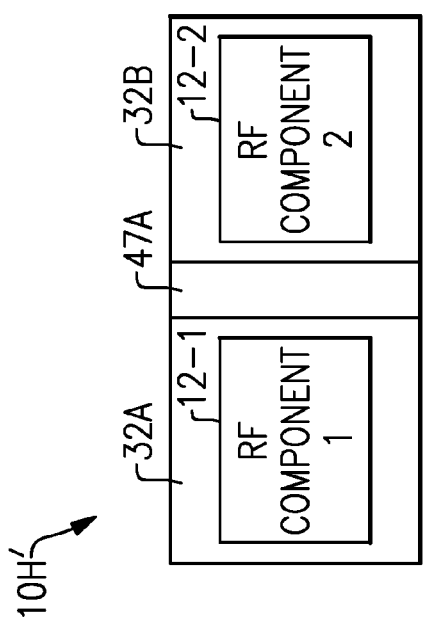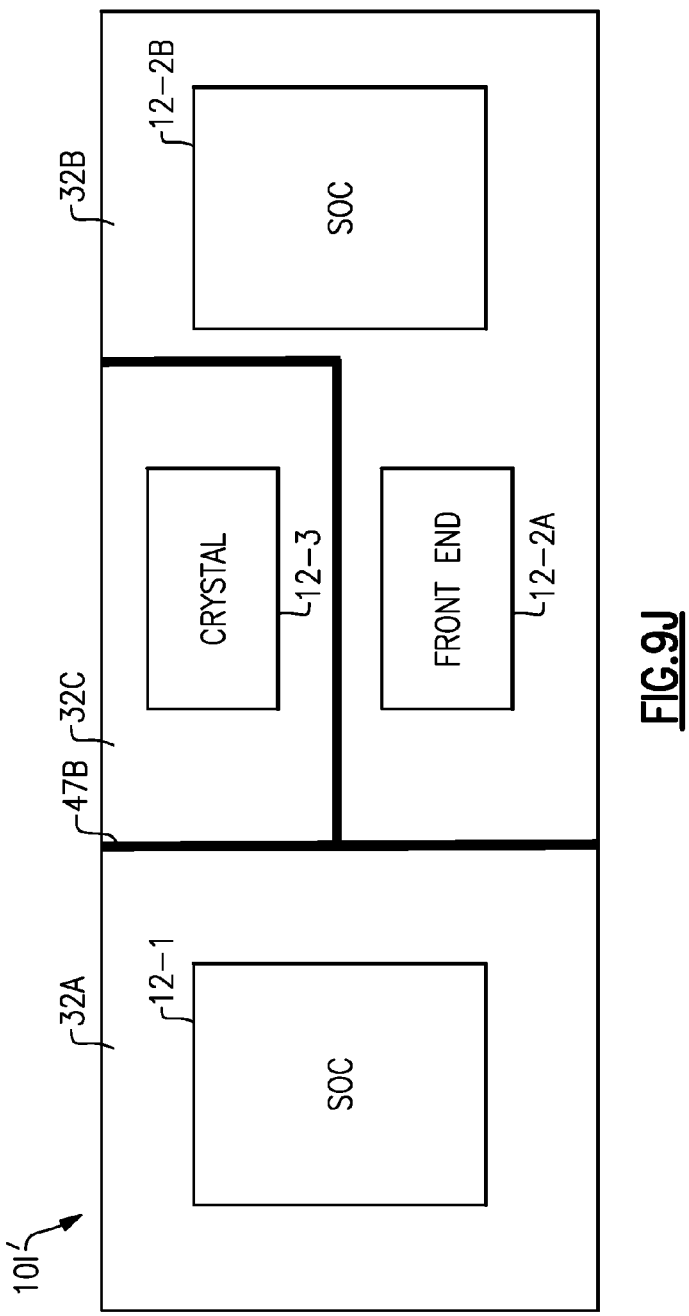

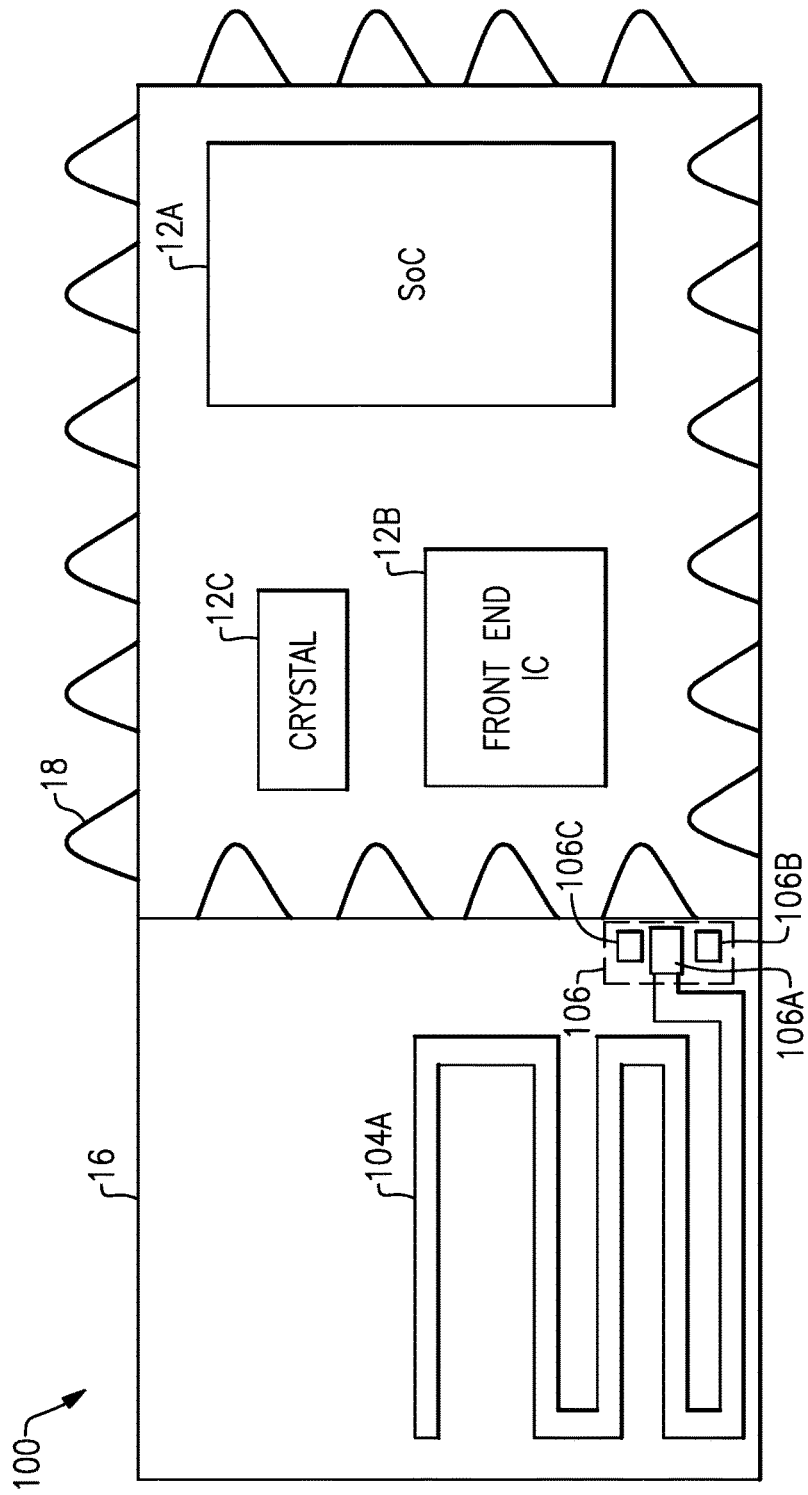

SELECTIVELY SHIELDING RADIO FREQUENCY MODULE WITH MULTI-LAYER ANTENNA

CROSS REFERENCE TO PRIORITY APPLICATIONS

This application claims the benefit of priority under 35 U.S.C. § 119(e) of U.S. Provisional Patent Application No. 62/324,768, filed Apr. 19, 2016 and titled "SELECTIVE SHIELDING OF RADIO FREQUENCY MODULES," the disclosure of which is hereby incorporated by reference in its entirety herein. This application claims the benefit of priority under 35 U.S.C. § 119(e) of U.S. Provisional Patent Application No. 62/324,750, filed Apr. 19, 2016 and titled "METHODS FOR SELECTIVELY SHIELDING RADIO FREQUENCY MODULES," the disclosure of which is hereby incorporated by reference in its entirety herein.

BACKGROUND

Technical Field

This disclosure relates to selective shielding of a radio frequency module.

Description of Related Technology

Packaged semiconductor modules can include integrated shielding technology within a package. A shielding structure can be formed around a radio frequency component. The shielding structure can shield the radio frequency component from electromagnetic radiation that is external to the shielding structure. The shielding structure can shield circuit elements external to the shielding structure from electromagnetic radiation emitted by the radio frequency component. As more components are being integrated together with each other in a radio frequency module, shielding components from each other in a compact and efficient manner can be challenging.

SUMMARY OF CERTAIN INVENTIVE ASPECTS

The innovations described in the claims each have several aspects, no single one of which is solely responsible for its desirable attributes. Without limiting the scope of the claims, some prominent features of this disclosure will now be briefly described.

One aspect of this disclosure is a packaged radio frequency module. The packaged radio frequency module includes a package substrate, a radio frequency shielding structure extending above the package substrate, a radio frequency component over the package substrate and in an interior of the radio frequency shielding structure, and an antenna on the package substrate external to the radio frequency shielding structure.

The radio frequency shielding structure can include a shielding layer providing a shield over the radio frequency component and leaving the packaged radio frequency module unshielded over the antenna. The radio frequency shielding structure can include wire bonds in contact with the shielding layer.

The radio frequency shielding structure can include wire bonds disposed between the antenna and the radio frequency component. The wire bonds can be configured to provide radio frequency shielding between the antenna and the radio frequency component. The radio frequency shielding structure can include wire bond walls disposed around at least two sides of the radio frequency component. The radio frequency shielding structure can include wire bond walls disposed around at least three sides of the radio frequency component. The radio frequency shielding structure can include wire bond walls surrounding the radio frequency component.

The radio frequency shielding structure can include a wire bond wall disposed around a first side of the radio frequency component and a conformal structure disposed around a second side of the radio frequency component, in which the second side opposes the first side. The radio frequency shielding structure can include a wire bond wall disposed around a side of the radio frequency component and a conformal structure disposed around another side of the radio frequency component.

The radio frequency shielding structure can include conformal walls surrounding the radio frequency component.

The radio frequency shielding structure can include a shielding layer substantially parallel to the package substrate. The radio frequency component can be disposed between the shielding layer and the package substrate. The shielding layer can include copper. The packaged radio frequency module can further include a protective layer over the shielding layer such that the shielding layer is disposed between the protective layer and the radio frequency component. The protective layer can include titanium.

The packaged radio frequency module can include features resulting from removing a mask over the antenna after forming the shielding layer.

The packaged radio frequency module includes features resulting from laser removal of material of the shielding layer over the antenna after forming the shielding layer.

A molding material can be disposed over the antenna. The antenna can be disposed along at least two sides of a perimeter of the radio frequency component.

The radio frequency component can include a radio frequency front end integrated circuit. The radio frequency component can further include a crystal. The radio frequency front end integrated circuit can include a silicon-on-insulator die.

The radio frequency component can include a low noise amplifier. The radio frequency component can include a multi-throw radio frequency switch. The radio frequency component can include a power amplifier.

The radio frequency component can be attached to the package substrate and the antenna can be printed on the package substrate. The package substrate can be a laminate substrate. In certain embodiments, the antenna can include a first portion on a first side of the package substrate and a second portion on a second side of the package substrate, in which the first side opposing the second side. According to some embodiments, the antenna can include a trace on the package substrate and a patterned conductive material over a molding material, in which the trace connected to the patterned conductive material by a wire bond.

Another aspect of this disclosure is a packaged radio frequency module that includes a package substrate, a radio frequency component on the package substrate, an antenna on the package substrate, and a shielding layer providing a shield over the radio frequency component and leaving the packaged radio frequency module unshielded over the antenna.

The packaged radio frequency module can further include one or more features of any of the radio frequency modules discussed herein.

Another aspect of this disclosure is a system board assembly that includes a packaged component and a system board on which the packaged component is disposed. The packaged component includes a radio frequency component on a package substrate, a radio frequency shielding structure around the radio frequency component, and an antenna on the package substrate and outside of the radio frequency shielding structure. The system board includes ground pads electrically connected to the radio frequency shielding structure of the packaged component.

The system board assembly can further include comprising an electronic component on the system board, and the shielding structure can provide radio frequency isolation between the radio frequency component and the electronic component.

The packaged component can include includes one or more features of the modules discussed herein.

Another aspect of this disclosure is a front end module that includes: a radio frequency (RF) component on a package substrate, the RF component including a low noise amplifier and a switch configured to selectively electrically connect the low noise amplifier with the antenna; an RF shielding structure disposed around the RF component; and an antenna on the package substrate, the antenna being external to the RF shielding structure.

The front end module can further include a bypass path, and the switch can be configured to electrically connect the low noise amplifier and the integrated antenna in a first state and to electrically connect the bypass path and the integrated antenna in a second state.

The front end module can further include a power amplifier, the switch and the switch can be configured to electrically connect the power amplifier and the integrated antenna in a third state. The low noise amplifier and the power amplifier circuit can be embodied on a single die. The die can be a semiconductor-on-insulator die.

The front end module can further include one or more features of any of the radio frequency modules discussed herein.

Another aspect of this disclosure is wireless communication device that includes: a packaged component including a radio frequency (RF) component on a package substrate, an RF shielding structure around the RF component, and an antenna on the package substrate and outside of the RF shielding structure; a transceiver in communication with the RF component; and a processor in communication with the transceiver.

The packaged component can further include one or more features of the RF modules discussed herein. The RF component can further include one or more features of the front end integrated circuits discussed herein.

Another aspect of this disclosure is packaged radio frequency (RF) module that includes a package substrate; an RF shielding structure; an RF component on the package substrate and in an interior of the RF shielding structure; and an electronic component on the package substrate external to the RF shielding structure, the electronic component being unshielded on a side opposite the package substrate.

The packaged radio frequency module can further include one or more features discussed herein.

Another aspect of this disclosure is an integrated circuit assembly that includes a carrier including a major surface and a printed antenna on the major surface; and a packaged component on the major surface of the carrier and disposed laterally from the printed antenna, the packaged component including a radio frequency component that is surrounded by a shielding structure.

The shielding structure can include a conformal shield around the packaged component.

The shielding structure can further include a ground pad on the carrier.

The radio frequency circuit can include at least one of a power amplifier, a low noise amplifier, or a radio frequency switch.

Another aspect of this disclosure is a method of manufacturing a radio frequency (RF) module. The method includes providing an RF module including an RF component and an antenna, and forming a shielding layer over a portion of the RF module such that (i) the RF component is shielded by the shielding layer and the antenna is unshielded by the shielding layer and (ii) the shielding layer is in contact with one or more conductive features arranged to provide shielding between the radio frequency component and the antenna.

The method can further include masking a portion of the RF module over the antenna with a mask prior to forming the shielding layer. Forming the shielding layer can include removing the mask over the antenna. Masking the portion of the RF module can include masking the RF module with a mask and laser cutting a selected area of the mask.

Forming the shielding layer can include laser removal of conductive material over the antenna.

Forming the shielding layer can include sputtering a conductive material and the shielding layer includes the conductive material. The conductive material can include copper. The method can further include forming a protective layer over the shielding layer such that the shielding layer is disposed between the protective layer and the RF component. The protective layer can include titanium.

The method can further include singulating the RF module prior to forming the shielding layer. Alternatively, the method can include singulating the RF module after to forming the shielding layer.

Forming the shielding layer can include forming the shielding layer such that the shielding layer is in contact with wire bonds disposed along at least one side of the RF component.

The RF module can include a package substrate on which the RF component and the antenna are disposed. The shielding layer can be formed substantially parallel to the package substrate, and the RF component can be disposed between the shielding layer and the package substrate after the shielding layer is formed.

The RF module can include a shielding structure that includes the shielding layer, in which the RF component is in an interior of the shielding structure and the antenna is external to the shielding structure. The shielding structure can include conductive features that extend over the packaging substrate to the shielding layer. The conductive features can include wire bonds. The conductive features can include wire bonds and a conformal layer. The shielding structure can include a plurality of wire bonds disposed between the antenna and the RF component and configured to provide RF shielding between the antenna and the RF component.

The shielding structure can include a wire bond wall disposed around a side of the RF component and a conformal structure disposed around another side of the RF component. The shielding structure can include a wire bond wall disposed around a side of the RF component and a conformal structure disposed around an opposing side of the RF component. The e shielding structure can include wire bond walls disposed around at least two sides of the RF component. The e shielding structure can include wire bond walls disposed around at least three sides of the RF component. The shielding structure can include wire bond walls surrounding the RF component. The shielding structure can include a plurality of wire bonds disposed between the antenna and the RF component and configured to provide RF shielding between the antenna and the RF component.

A molding material can be disposed over the antenna prior to forming the shielding layer. The antenna can be disposed along at least two sides of a perimeter of the RF component.

The RF component can include an RF front end integrated circuit. The RF component can include a crystal. The RF front end integrated circuit can include a silicon-on-insulator die.

The RF component can include a low noise amplifier. The RF component can include a multi-throw RF switch. The RF component can include a power amplifier. The package substrate can be a laminate substrate.

Another aspect of this disclosure is a method of manufacturing a radio frequency (RF) module. The method includes providing an RF module including an RF component and an antenna, masking a portion of the RF module over the antenna with a mask, forming a conductive layer over the RF module, and removing the mask such that a shielding layer is over the RF component and the antenna is unshielded by the shielding layer, the shielding layer including conductive material of the conductive layer.

Masking the portion of the RF module can include masking the RF module with a mask and laser cutting a selected area of the mask.

The shielding layer can be in contact with wire bonds disposed between the radio frequency component and the antenna after removing the mask.

Another aspect of this disclosure is a method of manufacturing a radio frequency (RF) module. The method includes providing an RF module including an RF component and an antenna, forming a conductive layer over the RF module, and removing conductive material of the conductive layer over the antenna such that a shielding layer is over the RF component and the antenna is unshielded by the shielding layer.

Removing the conductive material can include using a laser to remove the conductive material over the antenna.

The shielding layer can be in contact with wire bonds disposed between the radio frequency component and the antenna after removing the conductive material.

Another aspect of this disclosure is a radio frequency module manufactured by any of the methods discussed herein.

Another aspect of this disclosure is a packaged radio frequency module that includes a package substrate, a radio frequency component on the package substrate, a multi-layer antenna, and a radio frequency shielding structure configured to provide shielding between the multi-layer antenna and the radio frequency component.

The multi-layer antenna can include a first portion on a first side of the package substrate and a second portion on a second side of the package substrate, the first side opposing the second side. The multi-layer antenna can include a first conductive trace on a first side of the package substrate and a second conductive trace on a second side of the package substrate, in which the first side opposes the second side. The packaged radio frequency module can include a via in the package substrate. The first conductive trace can be connected to the second conductive trace by way of the via. The packaged radio frequency module can further include a pad on the second conductive trace, in which the pad is configured for connecting to a system board.

The multi-layer antenna can be implemented in two different layers on the same side of the package substrate. The multi-layer antenna can include a trace on the package substrate and a patterned conductive material over a molding material. The trace can be electrically connected to the patterned conductive material by a wire bond. The radio frequency shielding structure can include a shielding layer over the radio frequency component, in which the shielding layer being spaced apart from the package substrate by substantially the same distance as the patterned conductive material of the multi-layer antenna.

The packaged radio frequency module can further include a matching circuit coupled to the multi-layer antenna. The matching circuit can include a passive impedance element that is external to the radio frequency shielding structure.

The multi-layer antenna can be a folded monopole antenna.

The radio frequency component can include a front end integrated circuit, a crystal, and a system on a chip.

The radio frequency shielding structure can include a wire bond disposed between the multi-layer antenna and the radio frequency component.

The radio frequency shielding structure can include a conductive conformal structure disposed between the multi-layer antenna and the radio frequency component. The packaged radio frequency module can further include a through mold via having a sloped sidewall and the conductive conformal structure can be over the sloped sidewall.

Another aspect of this disclosure is a system board assembly that includes a packaged component and a system board. The packaged component includes a radio frequency component on a package substrate, a multi-layer antenna, and a radio frequency shielding structure around the radio frequency component and configured to provide shielding between the radio frequency component and the multi-layer antenna. The packaged component is disposed on the system board. The system board includes ground pads electrically connected to the radio frequency shielding structure.

The multi-layer antenna can include a first trace on a first side of the package substrate and a second trace on a second side of the package substrate, in which the first side opposes the second side. A pad on the second trace can be soldered to another pad on the system board.

Another aspect of this disclosure is a wireless communication device that includes a packaged radio frequency module and a transceiver. The packaged radio frequency module includes a radio frequency component on a package substrate, multi-layer antenna, and a radio frequency shielding structure that includes a conductive feature disposed between the radio frequency component and the multi-layer antenna. The transceiver is in communication with the radio frequency component.

The radio frequency component can be configured to provide a wireless personal area network signal and/or a wireless local area network signal to the multi-layer antenna.

For purposes of summarizing the disclosure, certain aspects, advantages and novel features of the innovations have been described herein. It is to be understood that not necessarily all such advantages may be achieved in accordance with any particular embodiment. Thus, the innovations may he embodied or carried out in a manner that achieves or optimizes one advantage or group of advantages as, taught herein without necessarily achieving other advantages as may be taught or suggested herein.

The present disclosure relates to U.S. patent application Ser. No .15/490,346, titled "SELECTIVE SHIIELDING OF RADIO FREQUENCY MODULES," filed on even date herewith, the entire disclosure of which is hereby incorporated by reference herein. The present disclosure relates to U.S. patent application Ser. No. 15/490,349, titled "METHODS FOR SELECTIVELY SHIELDING RADIO FREQUENCY MODULES," filed on even date herewith, the entire disclosure of which is hereby incorporated by reference herein.

BRIEF DESCRIPTION OF THE DRAWINGS

Embodiments of this disclosure will now be described, by way of non-limiting example, with reference to the accompanying drawings.

FIG. 4A is a flow diagram of an illustrative process that includes forming a shielding layer over a radio frequency component of a module and leaving an antenna unshielded according to an embodiment.

FIGS. 4B, 4C, 4D, and 4E illustrate an example module or strip of modules corresponding to various stages of the process of FIG. 4A according to an embodiment.

FIG. 5A is a flow diagram of another illustrative process that includes forming a shielding layer over a radio frequency component of a module and leaving an antenna unshielded according to an embodiment.

FIGS. 5B, 5C, 5D, 5E, and 5F illustrate an example module or strip of modules corresponding to various stages of the process of FIG. 5A according to an embodiment.

FIG. 6A is a flow diagram of another illustrative process that includes forming a shielding layer over a radio frequency component of a module and leaving an antenna unshielded according to an embodiment.

FIGS. 6B, 6C, 6D, 6E, and 6F illustrate an example module, strip of modules, or group of modules corresponding to various stages of the process of FIG. 6A according to an embodiment.

FIG. 7A is a flow diagram of another illustrative process that includes forming a shielding layer over a radio frequency component of a module and leaving an antenna unshielded according to an embodiment.

FIGS. 7B, 7C, 7D, 7E, and 7F illustrate an example module or group of modules corresponding to various stages of the process of FIG. 7A according to an embodiment.

FIG. 8A is a flow diagram of another illustrative process that includes forming a shielding layer over a radio frequency component of a module and leaving an antenna unshielded according to an embodiment.

FIGS. 8B, 8C, 8D, 8E, 8F, 8G, 8H, and 8I illustrate an example module, strip of modules, or group of modules corresponding to various stages of the process of FIG. 8A according to an embodiment.

FIG. 9I illustrates an example of a selectively shielded radio frequency module with an unshielded portion between two shielded portions according to an embodiment.

FIG. 9J illustrates an example of a selectively shielded radio frequency module with an unshielded portion between shielded portions according to an embodiment.

FIGS. 10A and 10B illustrate a radio frequency module that includes an integrated antenna implemented on opposing sides of a package substrate according to an embodiment. FIG. 10 is a top view of the radio frequency module. FIG. 10B is a bottom view of the radio frequency module.

DETAILED DESCRIPTION OF CERTAIN EMBODIMENTS

Figure 1:
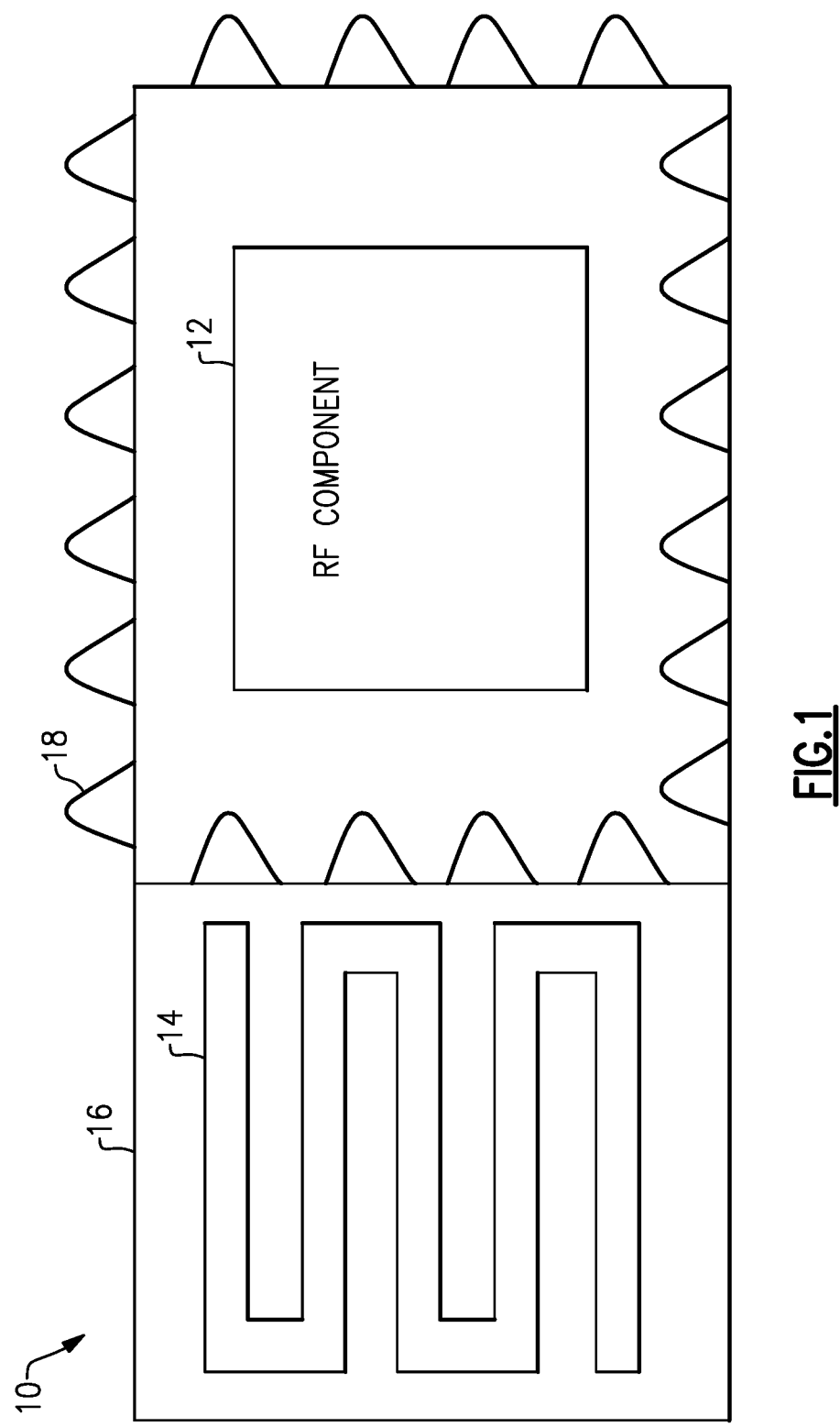
FIG. 1 is a schematic diagram of an example radio frequency module that includes a radio frequency component and an integrated antenna according to an embodiment.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Certain radio frequency (RF) modules can include a shielding structure to provide shielding for electromagnetic interference. Such shielding structures can shield an entire module and/or all circuitry of a module. In some instances, shielding may only be desired over a portion of a module. For instance, in a module with an RF circuit and an integrated antenna, it can be desirable to provide a shield around the RF circuit and leave the antenna unshielded. This can provide RF isolation for the RF circuit and also allow the antenna to receive and/or transmit signals without the shielding structure interfering. Accordingly, products with selective shielding can be desirable. Moreover, methods to form a shield over a selected portion of a module that are accurate and repeatable can be desirable for high volume manufacturing.

Aspects of this disclosure relate to methods of partially shielding a radio frequency module. Such methods can include forming a shielding layer over a shielded portion of the radio frequency module and leaving an unshielded portion of the radio frequency module unshielded. The shielding layer can shield a radio frequency circuit of the radio frequency module and leave an antenna of the radio frequency module unshielded. The shielding layer can be formed by way of an additive process or a subtractive process. For instance, the shielding layer can be formed by masking a portion of the radio frequency module with a mask, forming a shielding layer, and removing the mask so as to leave the area that was previously masked unshielded. As another example, the shielding layer can be formed by forming a conductive layer over the module and removing the conductive layer over a portion of the radio frequency module. A laser can be used to remove the conductive layer over the portion of the radio frequency module.

Another aspect of this disclosure is a packaged radio frequency (RF) module that is partially shielded. The RF module includes a package substrate, an RF shielding structure extending above the package substrate, an RF component over the package substrate and in an interior of the RF shielding structure, and an antenna on the package substrate external to the RF shielding structure.

FIG. 1 is a schematic diagram of an example RF module 10 that includes an RF component 12 and an integrated antenna 14 according to an embodiment. The RF module 10 can be a system in a package. FIG. 1 shows the RF module 10 in plan view without a top shielding layer. The top shielding layer can be formed, for example, in accordance with any of the processes described with reference to FIG. 4A, FIG. 5A, FIG. 6A, FIG. 7A, or FIG. 8A. As illustrated, the RF module 10 includes the RF component 12 on a package substrate 16, the antenna 14 on the package substrate 16, and wire bonds 18 attached to the package substrate 16 and surrounding the RF component 12. The antenna 14 of the RF module 10 is outside of an RF shielding structure around the RF component 12. Accordingly, the antenna 14 can wirelessly receive and/or transmit RF signals without being shielded by the shielding structure around the RF component 12. At the same time, the shielding structure can provide RF isolation between the RF component 12 and the antenna 14 and/or other electronic components.

The RF component 12 can include any suitable circuitry configured to receive, process, and/or provide an RF signal. For instance, the RF component 12 can include an RF front end, a crystal, a system on a chip, or any combination thereof. In certain implementations, the RF component 12 can include a power amplifier, a low-noise amplifier, an RF switch, a filter, a matching network, a crystal, or any combination thereof. An RF signal can have a frequency in the range from about 30 kHz to 300 GHz. In accordance with certain communications standards, an RF signal can be in a range from about 450 MHz to about 6 GHz, in a range from about 700 MHz to about 2.5 GHz, or in a range from about 2.4 GHz to about 2.5 GHz. In certain implementations, the RF component 12 can receive and/or provide signals in accordance with a wireless personal area network (WPAN) standard, such as Bluetooth, ZigBee, Z-Wave, Wireless USB, INSTEON, IrDA, or Body Area Network. In some other implementations, the RF component and receive and/or provide signals in accordance with a wireless local area network (WLAN) standard, such as Wi-Fi.

The antenna 14 can be any suitable antenna configured to receive and/or transmit RF signals. The antenna 14 can be a folded monopole antenna in certain applications. The antenna 14 can be any suitable shape. For instance, the antenna 14 can have a meandering shape as shown in FIG. 1. In other embodiments, the antenna can be U-shaped, coil shaped, or any other suitable shape for a particular application. The antenna 14 can transmit and/or receive RF signals associated with the RF component 12. The antenna 14 can occupy any suitable amount of area of the packaging substrate 16. For instance, the antenna 14 can occupy from about 10% to 75% of the area of the package substrate 16 in certain implementations.

The antenna 14 can be printed on the packaging substrate 16. A printed antenna can be formed from one or more conductive traces on the packaging substrate 16. The one or more conductive traces can be formed by etching a metal pattern on the packaging substrate 16. A printed antenna can be a microstrip antenna. Printed antennas can be manufactured relatively inexpensively and compactly due to, for example, their 2-dimensional physical geometries. Printed antennas can have a relatively high mechanical durability.

The package substrate 16 can be a laminate substrate. The package substrate 16 can include one or more routing layers, one or more insulating layers, a ground plane, or any combination thereof. In certain applications, the package substrate can include four layers. The RF component 12 can be electrically connected to the antenna 14 by way of metal routing in a routing layer of the packaging substrate 16 in certain applications.

The wire bonds 18 are part of an RF shielding structure around the RF component 12. An RF shielding structure can be any shielding structure configured to provide suitable shielding associated with RF signals. The wire bonds 18 can provide RF isolation between the antenna 14 and the RF component 12 so as to prevent electromagnetic interference between these components from significantly impacting performance of the antenna 14 or the RF component 12. The wire bonds 18 can surround the RF component 12 as illustrated. The wire bonds 18 can be arranged around the RF component 12 in any suitable arrangement, which can be rectangular as illustrated or non-rectangular in some other implementations. In the RF module 10 illustrated in FIG. 1, the wire bonds 18 form four walls around the RF component 12. The wire bonds 18 can be arranged such that adjacent wire bonds are spaced apart from each other by a distance to provide sufficient RF isolation between the RF component 12 and other electronic components.

Figure 2:
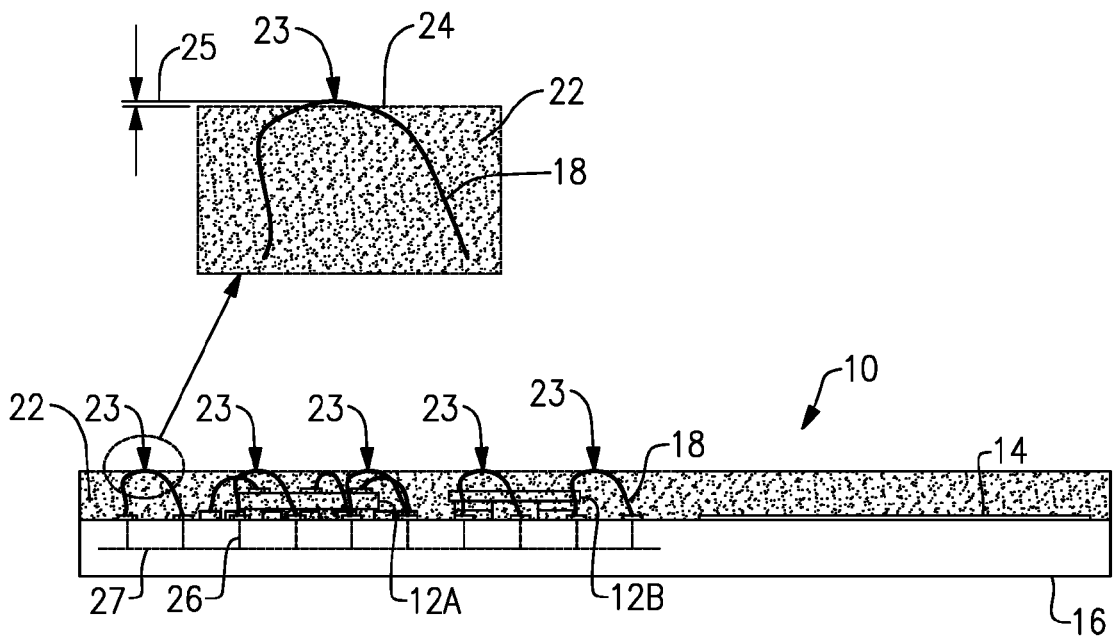
FIG. 2 is a cross sectional view of the radio frequency module of FIG. 1 prior to forming a shielding layer over the radio frequency component according to an embodiment.

FIG. 2 is a cross sectional view of the radio frequency module 10 of FIG. 1 prior to forming a shielding layer over the radio frequency component 12 according to an embodiment. As illustrated in FIG. 2, molding material 22 can be disposed over the RF component 12, the wire bonds 18, and the antenna 14. In FIG. 2, the RF component 12 includes two die 12A and 12B on the package substrate 16. Upper portions 23 of wire bonds 18 can extend above upper surface 24 of an overmold structure of the molding material 22 that is over the wire bonds 18. The wire bonds 18 can extend above the upper surface 24 to a top point 25 of the wire bonds 18. The upper portions 23 of the wire bonds 18 can be exposed by removing molding material after forming an overmold structure of the molding material 22. Having the upper portions 23 of the wire bonds 18 exposed as shown in FIG. 2 can allow a conductive layer over the molding material 22 to be in contact with the wire bonds 18 to thereby provide an electrical connection. FIG. 2 also illustrates vias 26 in the package substrate 16. The wire bonds 18 can be electrically connected to a ground plane 27 of the package substrate 16 by way of the vias 26. The wire bonds 18 can be electrically connected to a ground contact of a system board on which the module 10 is disposed by way of the vias 26.

Figure 3:
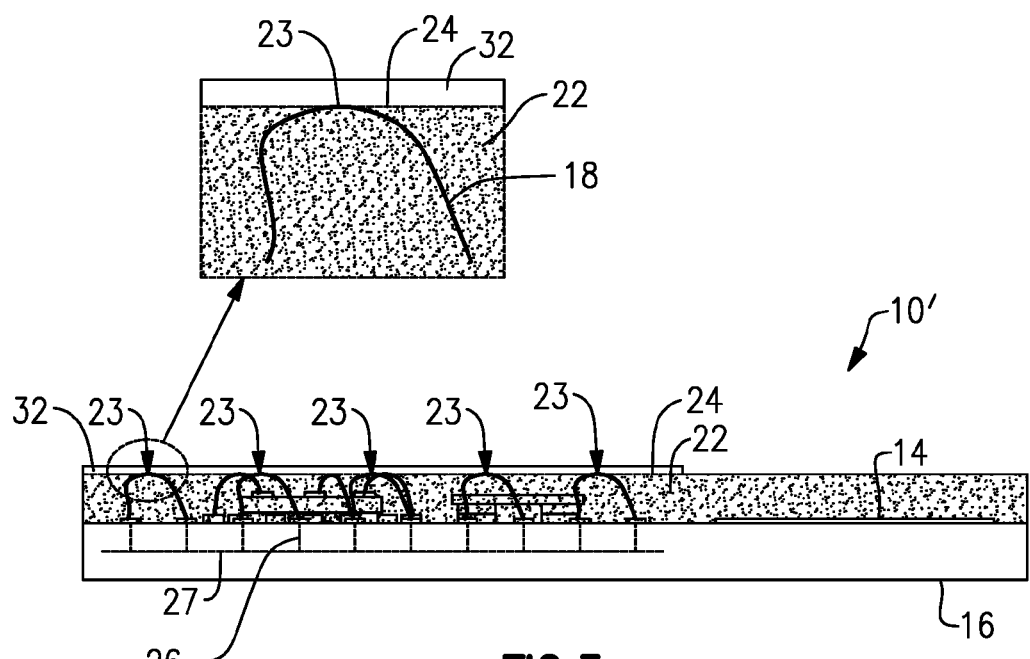
FIG. 3 is a cross sectional view of the radio frequency module of FIG. 1 with a shielding layer over the radio frequency component and not over the antenna according to an embodiment.

FIG. 3 is a cross sectional view of the radio frequency module of FIG. 1 with a shielding layer over the radio frequency component and not over the antenna according to an embodiment. The RF module 10' illustrated in FIG. 3 includes a shielding layer 32 formed over the upper surface 24 of the overmold structure over the RF component 12. The shielding layer 32 is formed over a shielded portion of the RF module 10' and an unshielded portion of the RF module 10' is left unshielded opposite the package substrate 16. As illustrated, the antenna 14 is included in the unshielded portion of the RF module 10'. The shielding layer 32 is formed of electrically conductive material. As shown in FIG. 3, the shielding layer 32 is in contact with wire bonds 18.

A shielding structure around the RF component 12 includes the shielding layer 32 and the wire bonds 18. The shielding structure can also include vias 26 in the package substrate 16, a ground plane 27 in the package substrate 16, ground pads and/or a ground plane of a system board on which the RF module 10 is disposed, or any combination thereof. RF The shielding structure can function as a Faraday cage around the RF component 12. The RF shielding structure can be configured at a ground potential. The RF shielding structure around the RF component 12 can shield the RF component 12 from signals external to the shielding structure and/or shield circuits outside of the shielding structure from the RF component 12. The antenna 14 is external to the shielding structure in FIG. 3.

A shielding layer, such as the shielding layer 32 of FIG. 3, can be formed over a portion of an RF module and a different portion of the RF module can be unshielded opposite a package substrate. Prior to forming the shielding layer over an RF module in any of the methods of forming the shielding layer discussed herein, the RF module can have molding material over an antenna and wire bonds with exposed upper portions that extend beyond of surface of an overmold structure of the molding material (e.g., as shown in FIG. 2). Examples methods of forming such a shielding layer will be discussed with reference to FIGS. 4A to 8I. RF modules discussed herein can include a shielding layer formed by any of these methods as appropriate and/or by any suitable operations discussed with reference to any of these methods. The shielding layer can be formed over a selected portion of an RF module by an additive process or a subtractive process. The methods of forming shielding layers discussed herein can be implemented in high volume manufacturing. Such methods can be automated in an accurate and repeatable manner.

FIG. 4A is a flow diagram of an illustrative process 40 that includes forming a shielding layer over a radio frequency component of a module and leaving an antenna unshielded according to an embodiment. The process 40 involves forming a shielding layer over a portion of an RF module by a subtractive method. In the process 40, a shielding layer can be formed over a plurality of RF modules, such as RF modules of a strip, concurrently. A conductive layer can be formed over the RF modules and the conductive layer can be removed over a selected portion of each of the RF modules using a laser. Methods of forming a shielding layer involving laser removal of a portion of a conductive layer can be advantageous for manufacturing RF modules that are relatively small in size. FIGS. 4B to 4E illustrate an example module or strip of modules corresponding to various stages of the process of FIG. 4A according to an embodiment.

At block 42, RF modules that include an RF component and an integrated antenna are provided. The RF modules can include one or more conductive features, such as wire bonds, disposed between the RF component and the antenna. The conductive features are RF isolation structures that are included in a shielding structure. FIG. 4B illustrates an example RF module 10A that can be provided at block 42. The RF module 10A can correspond to the RF module 10 of FIGS. 1 and 2. As illustrated, the RF module 10A of FIG. 4B includes an RF component 12 that includes components 12A, 12B, and 12C. As also illustrated in FIG. 4B, the wire bonds 18 can surround the RF component. Upper portions of the wire bonds 18 can be exposed, for example, as illustrated in FIG. 2.

A conductive layer can be formed over RF modules at block 44. The conductive layer can be in contact with wire bonds of the RF modules. The conductive layer can be a conformal layer formed by physical vapor deposition (PVD). A conductive material can be sputtered over a strip of RF modules. A strip of RF module can be any suitable array of multiple RF modules that are processed together. Sputtering can provide a conductive layer than is smoother than conductive layers formed by some other processes. The conductive material layer can include any suitable conductive material for RF shielding. For example, the conductive material can be copper. Copper can provide desirable electromagnetic interference shielding and copper is also relatively inexpensive. Another example conductive material for the conductive layer is tungsten nickel. A protective layer can be formed over the conductive layer. This can prevent corrosion of the conductive layer. As an example, a titanium layer can be provided over a copper conductive layer to protect the copper. FIG. 4C shows a strip of RF modules 43 with a conductive layer 41 formed over the entire upper surface of the strip of RF modules 43.

At block 46, the conductive layer can be removed over an antenna of an RF module. For instance, a laser can remove the conductive layer over the antenna of the RF module. The laser can remove any suitable portion of the conductive layer over the RF module. Laser beams can be applied concurrently to two or more RF modules of the group of RF modules. For instances, portions of the conductive layer over an antenna of each of the RF modules of the strip of RF modules can be removed concurrently. In some instances, laser beams can be applied sequentially to different RF modules of the group of RF modules. Removing a portion of the conductive layer with a laser can leave features on the RF module. For example, burn features, such as a halo ring, can be present on an RF component after laser removal of a portion of the conductive layer. Laser removal can result in a rougher surface finish over the antenna relative to some other methods of forming a partially shielded RF module, such as methods that involve masking.

FIG. 4D shows a laser beam 45 being applied to an RF module to remove a portion of the conductive layer 41. The laser can selectively remove the conductive layer over the RF module such that the RF module is left with an unshielded portion 47 and a shielded portion 49. Accordingly, a shielding layer can be disposed over the RF component and the antenna can be unshielded opposite the package substrate. As such, the antenna can transmit and/or receive RF signals without the shielding layer interfering. While FIG. 4D illustrates the laser beam 45 being applied to one module, laser beams are applied to a group of RF modules at block 46 of the process 46.

Referring to FIG. 4A, the strip of RF modules can be singulated into individual RF modules at block 48. Accordingly, singulation can occur after forming a shielding layer over a portion of an RF module. FIG. 4E shows a singulated RF module 10A' that includes a shielding layer over a portion of the packaging substrate.

FIG. 5A is a flow diagram of an illustrative process 50 that includes forming a shielding layer over a radio frequency component of a module and leaving an antenna unshielded according to an embodiment. The process 50 involves forming a shielding layer over a portion of an RF module by an additive method. In the process 50, masking material can be applied over selected portions of a plurality of RF modules of a strip, a conductive layer can be formed over the RF modules and the masking material, and the masking material can be removed. Methods of forming a shielding layer involving masking can be advantageous for manufacturing RF modules that are relatively large in size and/or for forming a shielding layer for a relatively small number of RF modules concurrently. FIGS. 5B to 5F illustrate an example module or strip of modules corresponding to various stages of the process of FIG. 5A according to an embodiment.

At block 51, RF modules that include an RF component and an integrated antenna are provided. The RF modules can include one or more conductive features, such as wire bonds, disposed between the RF component and the antenna. The conductive features are RF isolation structures that are included in a shielding structure. FIG. 5B illustrates an example RF module 10A that can be provided at block 51. The RF module 10A can correspond to the RF module 10 of FIGS. 1 and 2. The RF module 10A of FIG. 5B can also correspond to the RF module 10A of FIG. 4B. As illustrated, the RF module 10A of FIG. 5B includes an RF component 12 that includes components 12A, 12B, and 12C. As also illustrated in FIG. 5B, the wire bonds 18 can surround the RF component.

A masking material can be provided over selected portions of RF modules at block 53. A strip of RF modules can be masked concurrently and/or sequentially at block 53. The masking material can be relatively high temperature tape. The masking material can be applied over the antenna of each of the RF modules of a strip of RF modules. FIG. 5C shows a strip 52 of RF modules with masking material 54 formed over a selected portion of each RF module of the strip 52.

At block 55, a conductive layer is formed over the strip of RF modules. The conductive layer can be in contact with wire bonds of the RF modules. The conductive layer can be formed by way of PVD or spraying conductive material over the strip of RF modules. For example, the conductive layer can be formed in accordance with any of the principles and advantages discussed with reference to block 44 of the process 40. As another example, the conductive layer can be formed by spraying conductive paint, such as silver (Ag) based conductive paint, over the strip of RF modules. FIG. 5D shows a strip 52' of RF modules with a top surface covered by a conductive layer 41.

The masking material is removed at block 57. For instance, tape can be removed in any suitable manner. By removing the masking material, portions of the conductive layer that were formed over the masking material are also removed. Accordingly, the portion of the RF module that was covered by the masking material can be unshielded opposite the packaging substrate. Removing the masking material can leave features on the RF module. For example, a whisker feature and/or a relatively sharp step can be present from removing the masking material. FIG. 5E shows a strip 52" of RF modules with a top surface having shielded portions 49 and unshielded portions 47. In the shielded portions 49, a shielding layer 32 is included in a shielding structure around the RF component 12 of each RF module.

The strip of RF modules can be singulated into individual RF modules at block 58. In the process 50, singulation is performed after forming a shielding layer over a portion of an RF module. FIG. 5F shows an RF module 10A' that includes a shielding layer over a portion of the packaging substrate. The RF module 10A' of FIG. 5F can be similar to the RF module 10A' of FIG. 4E except that the RF module 10A' of FIG. 5F can include features resulting from removing a mask over the antenna and the RF module 10A' of FIG. 4E can include features resulting from laser removal of material of the shielding layer over the antenna.

Certain processes, such as the process 50 of FIG. 5A and the process 60 of FIG. 6B, include forming a shielding layer prior to singulation of RF modules. In some other processes, the shielding layer can be formed after singulation of RF modules. In such processes, a conformal structure can be formed along one or more edges of a singulated module while forming a conductive layer over the singulated module. The conformal structure can be included in a shielding structure around an RF component. The conformal structure implemented in place of wire bonds along one or more sides of an RF component. FIGS. 6A, 7A, and 8A are examples of processes that include forming a shielding layer after singulation of RF modules.

FIG. 6A is a flow diagram of an illustrative process 60 that includes forming a shielding layer over a radio frequency component of a module and leaving an antenna unshielded according to an embodiment. The process 60 involves forming a shielding layer over a portion of an RF module by an additive method. In the process 60, masking material can be applied over selected portions of a plurality of RF modules of a strip, the RF modules can be singulated, a conductive layer can be formed over the RF modules and the masking material, and the masking material can be removed. FIGS. 6B to 6F illustrate an example module, strip of modules, or group of singulated modules corresponding to various stages of the process of FIG. 6A according to an embodiment.

At block 61, RF modules that include an RF component and an integrated antenna are provided. The RF modules can include one or more conductive features, such as wire bonds, disposed between the RF component and the antenna. The conductive features are RF isolation structures that are included in a shielding structure. FIG. 6B illustrates an example RF module 10B that can be provided at block 61. The RF module 10B can generally correspond to the RF module 10 of FIGS. 1 and 2 and the RF module 10A of FIGS. 4B and 5B. The RF module 10B includes wire bonds 18 around fewer sides of the RF component 12 than the RF modules 10 and 10A. As illustrated in FIG. 6B, the wire bonds 18 are disposed between the RF component 12 and the antenna 14. The illustrated wire bonds 18 form a wall of wire bonds between the RF component 12 and the antenna 14. As also illustrated, the RF module 10B of FIG. 6B includes an RF component 12 that includes components 12A, 12B, and 12C.

A masking material can be provided over selected portions of RF modules at block 63. A strip of RF modules can be masked concurrently and/or sequentially at block 63. The masking material can be relatively high temperature tape. The masking material can be relatively low adhesion tape. The masking material can be applied over the antenna of each of the RF modules of a strip of RF modules. FIG. 6C shows a strip 52 of RF modules with masking material 54 formed over a selected portion of each RF module of the strip 52.

At block 65, RF modules can be singulated. For instance, a jig saw can separate individual RF modules from each other. The singulated RF modules can be provided to a PVD ring. FIG. 6D shows a group of singulated RF modules 66 prior to a shielding layer being formed thereon.

A conductive layer is formed over the singulated RF modules at block 67. The conductive layer can be in contact with wire bonds of a singulated RF module. The conductive layer can be formed by way of sputtering. For example, the conductive layer can be formed in accordance with any of the principles and advantages discussed with reference to block 44 of the process 40 as applied to singulated modules. FIG. 6E shows a group of singulated RF modules 66' with a conductive layer formed thereon. The conductive layer is substantially parallel to a package substrate of the RF module.

At block 67, conformal conductive layers can also be formed along edges of singulated RF modules. The conformal conductive layers can be substantially orthogonal to and in contact with the conductive layer that is substantially parallel to the package substrate. Accordingly, the shielding structure around the RF component can include the wire bonds 18 around one side of the RF component, conformal conductive layers around three sides of the RF component, and a shielding layer over the RF component. In other embodiments, wire bonds can be disposed along two or three sides of the RF component and conformal conductive layers can be disposed along the other side(s) of the RF component. Examples of such embodiments correspond to FIGS. 9E and 9F.

The masking material is removed at block 69. The masking material can be removed while the singulated RF modules are picked and placed into a tray. The masking material can be removed in any suitable manner, such as peeling the masking material or dissolving the masking material. By removing the masking material, portions of the conductive layer that were formed over the masking material are removed. Accordingly, the portion of the RF module that was covered by the masking material can be unshielded opposite the packaging substrate. Removing the masking material can leave features on the RF module. For example, a whisker feature and/or a relatively sharp step can be present from removing the masking material. FIG. 6F shows an RF module 10B' that includes a shielding layer over a portion of the packaging substrate.

FIG. 7A is a flow diagram of an illustrative process 70 that includes forming a shielding layer over a radio frequency component of a module and leaving an antenna unshielded according to an embodiment. The process 70 involves forming a shielding layer over a portion of an RF module by a subtractive method. For instance, a selected portion of a conductive layer of a singulated RF module can be removed using a laser in the process 70 instead of by masking in the process 60 of FIG. 6. The process 70 involves forming a conductive layer over the singulated RF modules and then removing a selected portion of the conductive layer. FIGS. 7B to 7F illustrate an example module or group of singulated modules corresponding to various stages of the process of FIG. 7A according to an embodiment.

At block 71, RF modules that include an RF component and an integrated antenna are provided. The RF modules can include one or more conductive features, such as wire bonds, disposed between the RF component and the antenna. The conductive features are RF isolation structures that are included in a shielding structure. FIG. 7B illustrates an example RF module 10B that can be proved at block 71. The RF module 10B can generally correspond to the RF module 10 of FIGS. 1 and 2 and the RF module 10A of FIGS. 4B and 5B. The RF module 10B of FIG. 7B can correspond to the RF module 10B of FIG. 6B. As illustrated, the RF module 10B of FIG. 7B includes an RF component 12 that includes components 12A, 12B, and 12C. As also illustrated in FIG. 7B, the wire bonds 18 are disposed between the RF component 12 and the antenna 14. The illustrated wire bonds 18 form a wall of wire bonds between the RF component 12 and the antenna 14.

RF modules can be singulated at block 73. For instance, a jig saw can separate individual RF modules from each other. The singulated RF modules can be provided to a PVD ring. FIG. 7B shows a group of singulated RF modules 74 prior to a conductive layer being formed thereon. The RF modules 74 can correspond to the RF modules 66 of FIG. 6D without masking material formed thereon.

A conductive layer is formed over the singulated RF modules at block 75. The conductive layer can be in contact with wire bonds of the singulated RF module. The conductive layer can be formed by way of sputtering. For example, the conductive layer can be formed in accordance with any of the principles and advantages discussed with reference to block 44 of the process 40 as applied to singulated modules. FIG. 7C shows a group of singulated RF modules 74' with a conductive layer formed thereon. The conductive layer is substantially parallel to a package substrate of the RF module.

At block 75, conformal conductive layers can also be formed along edges of singulated RF modules. The conformal conductive layers can be substantially orthogonal to and in contact with the conductive layer that is substantially parallel to the package substrate. Accordingly, the shielding structure around the RF component can include the wire bonds 18 around one side of the RF component, conformal conductive layers around three sides of the RF component, and a shielding layer over the RF component. In other embodiments, wire bonds can be disposed along two or three sides of the RF component and conformal conductive layers can be disposed along the other side(s) of the RF component. Examples of such embodiments correspond to FIGS. 9E and 9F.

A selected portion of the conductive layer can be removed over an antenna of an RF module at block 77. For instance, a laser can remove the conductive layer over the antenna of the RF module. Removing a portion of the conductive layer with a laser can leave features on the RF module. For example, burn features, such as a halo ring, can be present on an RF component after laser removal of a portion of the conductive layer. Laser removal can result in a rougher surface finish over the antenna relative to some other methods of forming a partially shielded RF module, such as methods that involve masking. The laser removal can involve any of the principles and discussed with reference to block 46 of the process 40 as applied to laser removal of a selected portion of a conductive layer of one or more singulated RF modules. In the process 70, laser removal is performed after singulation. By contrast, in the process 40, laser removal of a selected portion of the conductive layer is performed prior to singulation.

FIG. 7E shows a laser beam 45 being applied to a singulated RF module. The laser can selectively remove the conductive layer over the RF module so that the RF module is left with an unshielded portion 47 and a shielded portion 49. Accordingly, a shielding layer can be disposed over the RF component and the antenna can be unshielded opposite the package substrate. As such, the antenna can transmit and/or receive RF signals without the shielding layer interfering.

At block 77, singulated RF modules are picked and placed into a tray. FIG. 7F shows an RF module 10B' that includes a shielding layer over a portion of the packaging substrate that includes an RF component.

FIG. 8A is a flow diagram of an illustrative process 80 that includes forming a shielding layer over a radio frequency component of a module and leaving an antenna unshielded according to an embodiment. The process 80 involves forming a shielding layer over a portion of an RF module by an additive method. Masking material can be applied over a panel of RF modules, the masking material can be cut and a portion of the masking material can be removed, a conductive layer can be formed, and the remaining masking material can be removed. FIGS. 8B to 8I illustrate an example module, strip of modules, or group of singulated modules corresponding to various stages of the process of FIG. 8A according to an embodiment.

At block 81, RF modules that include an RF component and an integrated antenna are provided. The RF modules can include one or more conductive features, such as wire bonds, disposed between the RF component and the antenna. The conductive features are RF isolation structures that are included in a shielding structure. FIG. 8B illustrates an example RF module 10B that can be provided at block 81. The RF module 10B can generally correspond to the RF module 10 of FIGS. 1 and 2 and the RF module 10A of FIGS. 4B and 5B. The RF module 10B of FIG. 8B can correspond to the RF module 10B of FIG. 6B and the RF module 10B of FIG. 7B. As illustrated, the RF module 10B of FIG. 8B includes an RF component 12 that includes components 12A, 12B, and 12C. As illustrated in FIG. 8B, the wire bonds 18 are disposed between the RF component 10B and the antenna 14. The illustrated wire bonds 18 form a wall of wire bonds between the RF component 10B and the antenna 14.

A masking material can be provided over RF modules at block 83. The masking material can cover a strip of RF modules. The masking material can include any suitable features of the masking materials discussed herein. FIG. 8C shows a strip 82 of RF modules with masking material 54 formed over the top surface of each of the RF modules of the strip 52. While the masking material is formed over the entire top surface of the RF modules in FIG. 8C, the masking material can be formed over any suitable portion of the top surface of the RF modules in some other embodiments.

The masking material can be laser cut at block 85. The masking material can be laser cut such that masking material can be over the RF modules in any desired shape. Such desired shapes may be rectangular. In some other embodiments, the desired shapes can be non-rectangular. For instance, curved features, circular features, elliptical features, non-rectangular polygonal features, or any combination thereof can be laser cut. FIG. 8D shows a strip 82' of RF modules with masking material 54 that is laser cut.

At block 87, a portion of the masking material can be removed. Accordingly, masking material can remain over a portion of an RF module that will be unshielded after the process 80. For instance, the masking material can remain over the antenna of an RF module. FIG. 8E shows a strip 82" of RF modules with masking material 54 after partial removal.

RF modules can be singulated at block 89. For instance, a jig saw can separate individual RF modules from each other. The singulated RF modules can be provided to a PVD ring. FIG. 8F shows a group of singulated RF modules 90 prior to a conductive layer being formed thereon. FIG. 8G shows a singulated RF module with masking material 54 over a portion that will be unshielded after the process 80. The group of singulated RF modules 90 can include a plurality of such modules. The RF modules 90 can correspond to the RF modules 66 of FIG. 6D with a different pattern of masking material formed thereon.

A conductive layer is formed over the singulated RF modules at block 91. The conductive layer can be in contact with wire bonds of a singulated RF module. The conductive layer can be sputtered over the RF modules. The conductive layer can be formed by way of PVD. For example, the conductive layer can be formed in accordance with any of the principles and advantages discussed with reference to forming the conductive layer in any of the methods discussed herein as suitable. FIG. 8H shows a group of singulated RF modules 90' with conductive layers formed thereon. The conductive layer of each RF module is substantially parallel to a package substrate of the RF module.

At block 91, conformal conductive layers can also be formed along edges of singulated RF modules. The conformal conductive layers can be substantially orthogonal to and in contact with the conductive layer that is substantially parallel to the package substrate. Accordingly, the shielding structure around the RF component can include the wire bonds 18 around one side of the RF component, conformal conductive layers around three sides of the RF component, and a shielding layer over the RF component. In other embodiments, wire bonds can be disposed along two or three sides of the RF component and conformal conductive layers can be disposed along the other side(s) of the RF component. Examples of such embodiments correspond to FIGS. 9E and 9F.

The remaining masking material is removed at block 93. The masking material can be removed in any suitable manner. By removing the masking material, portions of the conductive layer that were formed over the masking material are removed. Accordingly, the portion of the RF module that was covered by the masking material can be unshielded opposite the packaging substrate. Removing the masking material can leave features on the RF module. For example, a whisker feature and/or a relatively sharp step can be present from removing the masking material. FIG. 8I shows a RF module 10B' with a top surface having a shielded portion and an unshielded portion. In the shielded portion, a shielding layer can be included in a shielding structure around an RF component. The antenna of the RF module can be unshielded opposite the package substrate in the unshielded portion.

At block 95, singulated RF modules are picked and placed into a tray.

FIGS. 9A to 9F are schematic diagrams of examples of selectively shielded RF modules according to certain embodiments. Any of the principles and advantages discussed in connection with any of these embodiments can be implemented in connection with any other of these embodiments and/or any other embodiments discussed herein as suitable. Similar to FIG. 1, the RF modules of FIGS. 9A to 9F are shown in plan view without a top shielding layer. The top shielding layer can be formed, for example, in accordance with any of the principles and advantages discussed with reference to one or more of the processes of FIG. 4A, FIG. 5A, FIG. 6A, FIG. 7A, or FIG. 8A. A shielding layer can be formed over the RF component of each of these RF modules and the antenna of each of these RF modules can be unshielded. Wire bonds of each of these modules can be in contact with the shielding layer such that both the wire bonds and the shielding layer are part of a shielding structure around an RF component. Although FIGS. 9A to 9F illustrate RF modules with a single antenna, any suitable principles and advantages discussed herein can be applied to RF modules that include two or more integrated antennas.

Figure 9A:
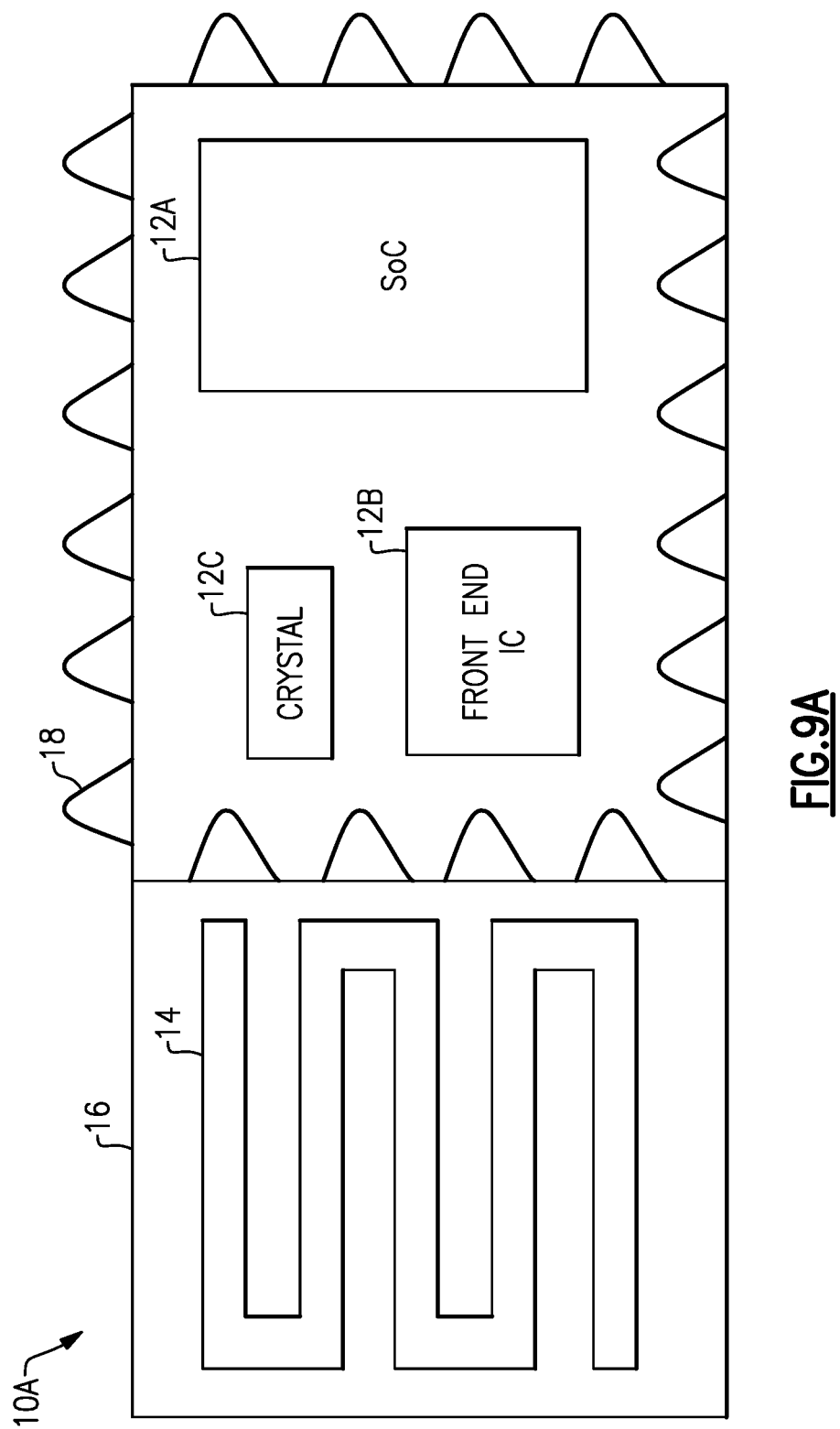
FIG. 9A is a schematic diagram of an example of a radio frequency module according to an embodiment.
Figure 9B:
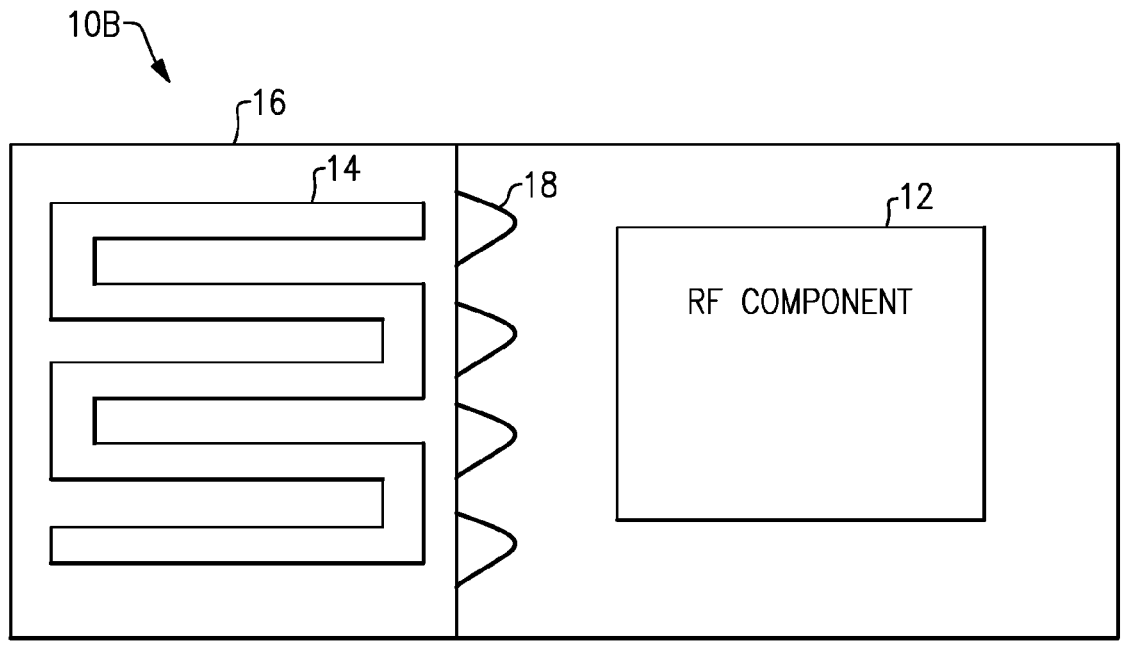
FIG. 9B is a schematic diagram of an example of a radio frequency module according to an embodiment.
Figure 9C:
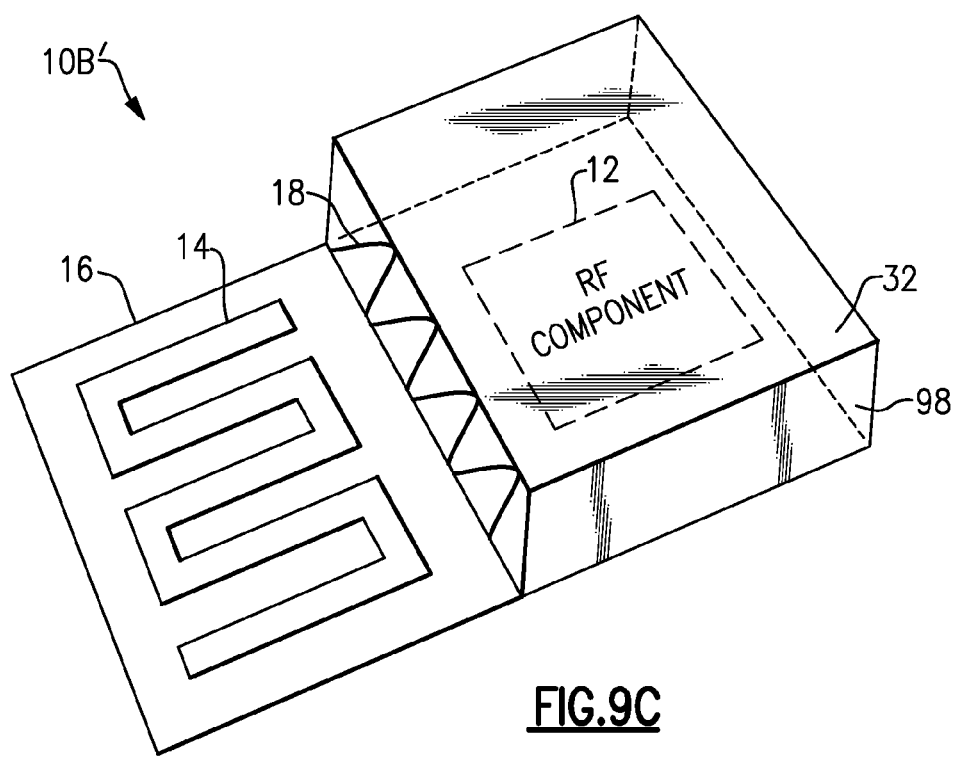
FIG. 9C is another view of the radio frequency module of FIG. 9B after a shielding layer and a conformal structure are formed.
Figure 9D:
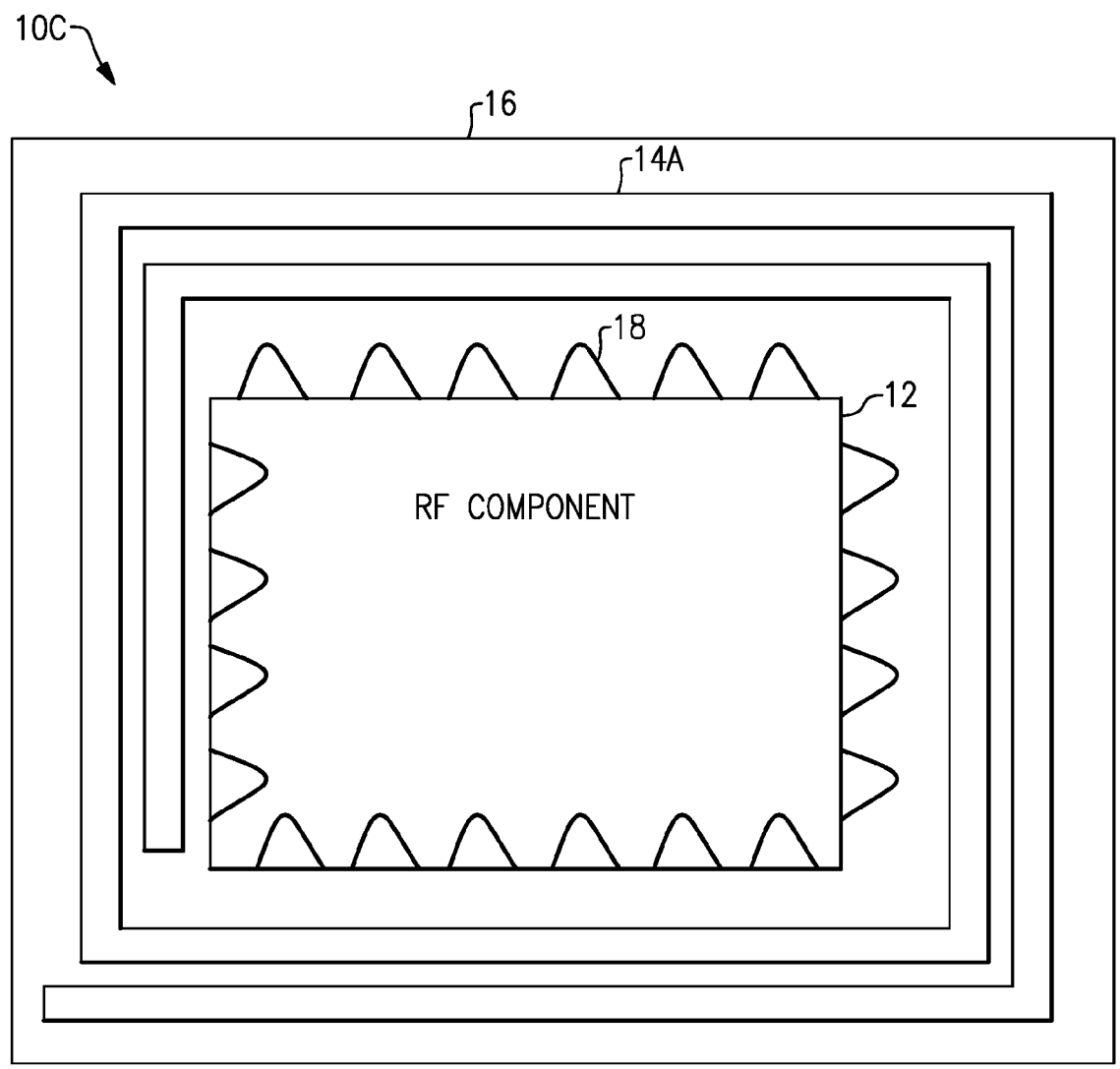
FIG. 9D is a schematic diagram of an example of a selectively shielded radio frequency module according to an embodiment.
Figure 9E:
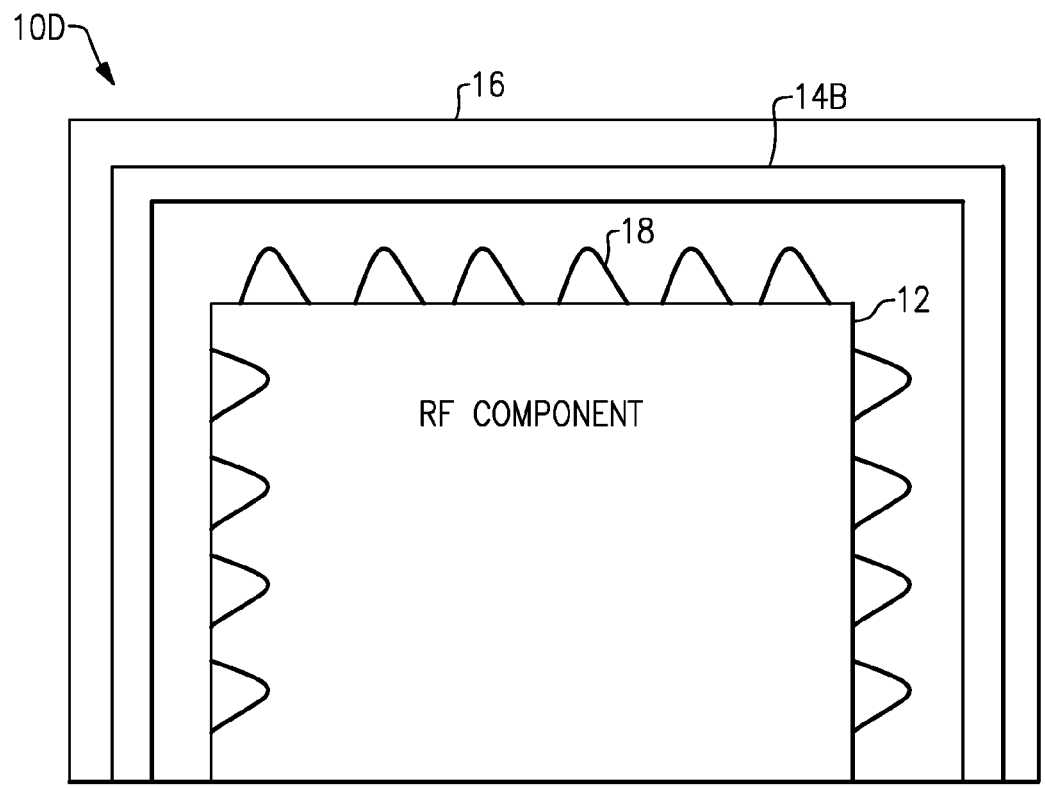
FIG. 9E is a schematic diagram of an example of a selectively shielded radio frequency module according to an embodiment.
Figure 9F:
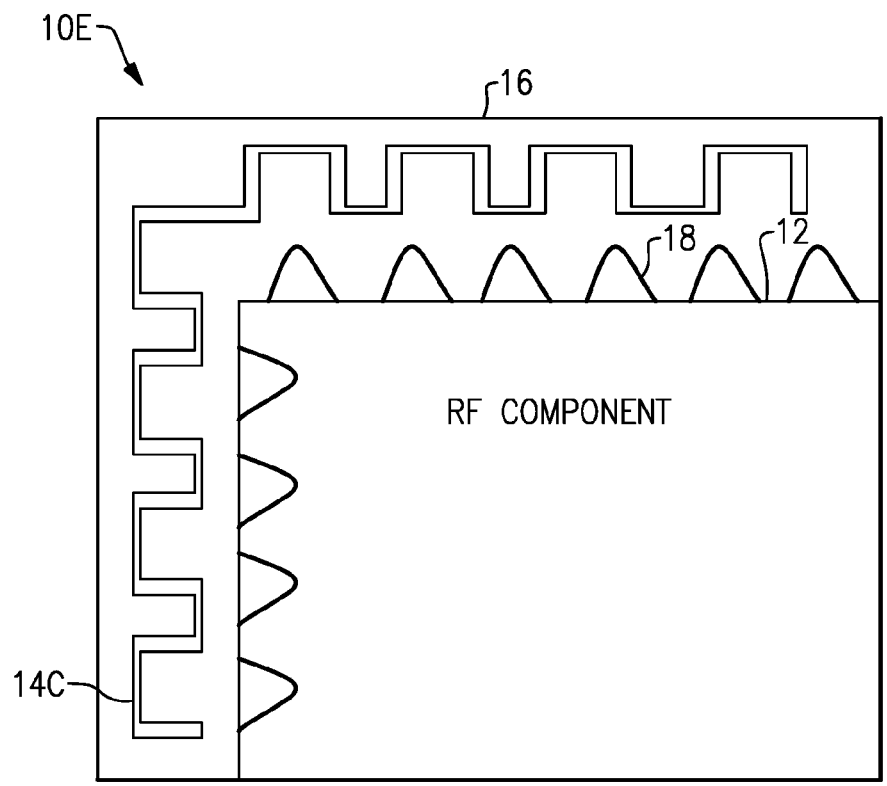
FIG. 9F is a schematic diagram of an example of a selectively shielded radio frequency module according to an embodiment.

FIGS. 9A to 9F illustrate various RF modules in accordance with the principles and advantages discussed herein. Each of these RF modules can be selectively shielded in accordance with any suitable principles and advantages discussed herein. FIGS. 9A to 9F illustrate that various RF components can be implemented within a shielding structure, that various shielding structures can be implemented, that antennas can have various shapes and/or positions, or any suitable combination thereof. For instance, FIG. 9A shows an example of an RF component that includes three different elements. Other RF components can alternatively or additionally be implemented. FIGS. 9B, 9C, 9E, and 9F show that shielding structures can include one, two, or three walls of wire bonds and conductive conformal structure(s) can be disposed along other sides of the RF module to shield the RF component. Wire bonds can surround the RF component of the RF module in embodiments in which a shielding layer is formed prior to singulation of the RF modules. A conformal layer can be disposed along at least one side the RF component of the RF module in embodiments in which a shielding layer is formed after singulation of the RF modules. The conformal structure can include any suitable conductive material. For example, the conductive conformal structure can include the same conductive material as the shielding layer in certain applications. FIGS. 9D, 9E, and 9F show example antenna positions and shapes. Any of the RF modules discussed herein can include an antenna that is suitably positioned and of any suitable size and shape for a particular application.

FIG. 9A is a schematic diagram of an example RF module 10A according to an embodiment. The RF module 10A of FIG. 9A shows that the RF component 12 of FIG. 1 can include a system on a chip 12A, a front end integrated circuit 12B, and a crystal 12C. The RF module 10A of FIG. 9A is an example of an RF module that can be provided in the process 40 of FIG. 4A and/or in the process 50 of FIG. 5A.

FIG. 9B is a schematic diagram of an example RF module 10B according to an embodiment. The RF module 10B of FIG. 9B is an example of an RF module that can be provided in the process 60 of FIG. 6A, the process 70 of FIG. 7A, or the process 80 of FIG. 8A. The RF module 10B of FIG. 9B is like the RF module 10 of FIG. 1 except that wire bonds 18 are not surrounding the RF component 12. In FIG. 9B, wire bonds 18 are disposed between the RF component 12 and the antenna 14. The remaining sides around the RF component in FIG. 9B are free from wire bonds.

FIG. 9C shows the radio frequency module of FIG. 9B after a shielding layer 32 and a conductive conformal structure 98 are formed. As illustrated in FIG. 9C, the conductive conformal structure 98 can be formed along the outer edges of the module 10B'. Such a conductive conformal structure can be formed, for example, as described in connection with the process 60 of FIG. 6A, the process 70 of FIG. 7A, or the process 80 of FIG. 8A. Accordingly, the shielding structure around the RF component 12 in FIG. 9C includes wire bonds 18 disposed between the RF component 12 and the antenna 14 and a conductive conformal structure 98 that includes three conformal conductive sides along edges of the RF module 10B'. The wire bonds 18 and the conformal conductive surfaces can be in contact with the shielding layer 32 disposed over the RF component 12. The wire bonds 18 illustrated in FIGS. 9B and 9C are arranged as a wall. In some other instances, the conductive conformal structure can also be along edges of the module 10B' around the antenna 14. The shielding layer can be formed over the RF component 12 and the antenna 14 can be unshielded opposite the package substrate 16.

FIG. 9D is a schematic diagram of an example RF module 10C according to an embodiment. The RF module 10C of FIG. 9D is like the RF module 10 of FIG. 1 except that an antenna 14A surrounds the RF component 12 and the antenna 14A has a different shape than the antenna 14 of FIG. 1. A shielding layer opposite the package substrate 16 can shield the RF component 12 and leave the antenna 14A unshielded.

FIG. 9E is a schematic diagram of an example RF module 10D according to an embodiment. The RF module 10D of FIG. 9E is like the RF module 10 of FIG. 1 except both the shielding structure and the antenna are different. In the RF module 10D shown in FIG. 9E, the shielding structure includes three walls of wire bonds 18 around the RF component 12. A conformal conductive layer can be formed along the side that is free from wire bonds. The conformal conductive layer and a shielding layer can be included in the shielding structure. The antenna 14B has a different position and shape than the antenna 14 of FIG. 1. The antenna 14B shown in FIG. 9E is disposed around three of four side of the RF component 12. A shielding layer opposite the package substrate 16 can shield the RF component 12 and leave the antenna 14B unshielded.

FIG. 9F is a schematic diagram of an example RF module 10E according to an embodiment. The RF module 10E of FIG. 9F is like the RF module 10 of FIG. 1 except the shielding structure and the antenna are different. In the RF module 10E shown in FIG. 9F, the shielding structure includes two walls of wire bonds 18 around the RF component 12. A conformal conductive layer can be formed along the sides that are free from wire bonds. The conformal conductive layer and a shielding layer can be included in the shielding structure. The antenna 14C has a different position and shape than the antenna 14 of FIG. 1. The antenna 14C shown in FIG. 9F is disposed around two of four sides of the RF component 12. A shielding layer opposite the package substrate 16 can shield the RF component 12 and leave the antenna 14C unshielded.

Radio frequency modules can be selectively shielded such that a shielding layer opposite a package substrate covers any suitable portion of the radio frequency module. Such a shielding layer can have any suitable pattern for a desired application. The pattern can be formed by ablating conductive material, such as by laser scribing, and/or by removing a mask to remove conductive material. The pattern can have any suitable shape and/or size. For instance, such a pattern could cover an RF component shown in any of FIGS. 9A to 9F.

The unshielded portion of the radio frequency module can be exposed by ablation. An ablation pattern can be any suitable pattern for a desired application. For example, the ablation pattern can be a line, multiple lines such as multiple intersecting lines, a block, etc. Removing masking material can alternatively perform a similar function as ablating conductive material. Accordingly, an unshielded portion of a radio frequency module can have a shape of one or more lines and/or one or more blocks in plan view. In some instances, an unshielded portion of a radio frequency module can separate different shielded portions of the radio frequency module.

While the radio frequency modules of FIGS. 9A to 9F include an unshielded portion over an antenna, an unshielded portion can be over one or more other circuit elements (such as one or more matching circuits, one or more filters, one or more duplexers, the like, or any suitable combination thereof) and/or between circuitry of different portions of a radio frequency module. In certain applications, shielding structures can be segmented to keep one portion of a radio frequency module from interfering with another portion of the radio frequency module.

FIGS. 9G to 9J are diagrams of examples of selectively shielded RF modules according to certain embodiments. Any of the principles and advantages discussed in connection with any of these embodiments can be implemented in connection with any other of these embodiments and/or any other embodiments discussed herein as suitable. For instance, the top shielding layers of FIGS. 9G to 9J can be formed in accordance with any suitable principles and advantages discussed with reference to one or more of FIG. 4A, FIG. 5A, FIG. 6A, FIG. 7A, or FIG. 8A.

Figure 9G:
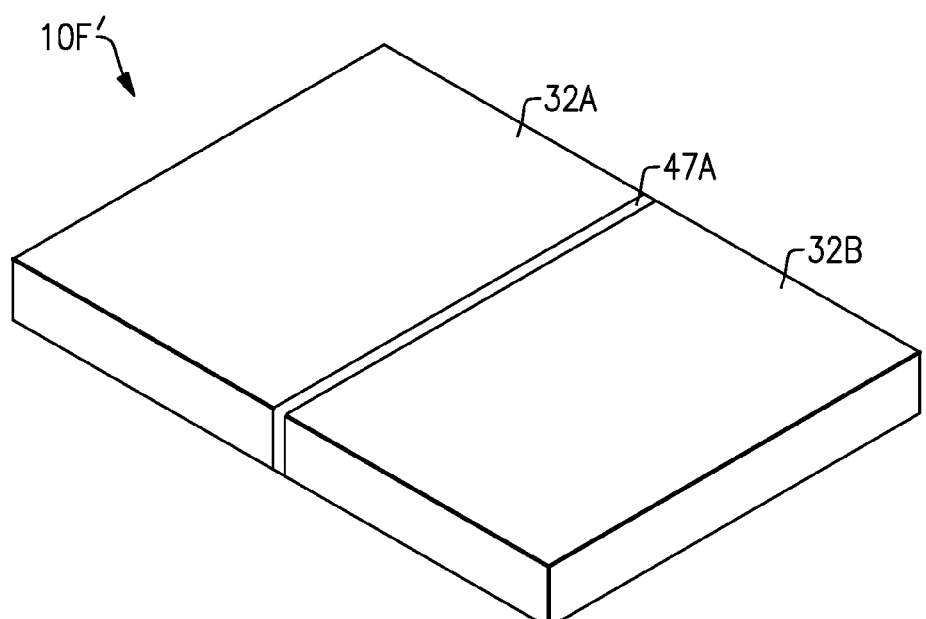
FIG. 9G illustrates an example of a shielded radio frequency module with an ablation pattern leaving a portion of the radio frequency module unshielded according to an embodiment.

FIG. 9G illustrates a shielded radio frequency module 10F' with an ablation pattern leaving a portion of the radio frequency module unshielded according to an embodiment. The ablation pattern can extend over a top of the radio frequency module 10F' and also over opposing sides of the radio frequency module 10F'. The ablation pattern can be formed by laser scribing, for example. Such laser scribing can remove conductive material and leave an unshielded portion 47A that is free from the conductive material over a molding material. The laser scribing can also remove some molding material (e.g., about 5 microns of molding material) in the unshielded portion 47A. A width of the illustrated ablation pattern can be in a range from about 40 to 150 microns, such as about 100 microns, in certain applications.

As shown in FIG. 9G, unshielded portion 47A separates a first shielding structure from a second shielding structure. The first shielding structure can provide shielding for an RF component. The illustrated first shielding structure includes a top shielding layer 32A and three conformal sides. The three conformal sides can be substantially orthogonal to the top shielding layer 32A. The conformal sides can be connected to ground and provide a ground connection for the top shielding layer 32A. The first shielding structure can also include wire bonds on the fourth side adjacent to the unshielded portion 47A. Such wire bonds can be in contact with the top shielding layer 32A. Alternatively, a conductive conformal structure can be formed along the fourth side and in contact with the top shielding layer 32A. The second shielding structure can provide shielding for another electronic component, such as another RF component. The illustrated second shielding structure includes a top shielding layer 32B and three conformal sides. The three conformal sides can be substantially orthogonal to the top shielding layer 32B. The conformal sides can be connected to ground and provide a ground connection for the top shielding layer 32B. The second shielding structure can also include wire bonds on the fourth side adjacent to the unshielded portion 47A. Such wire bonds can be in contact with the top shielding layer 32B. Alternatively, a conductive conformal structure can be formed along the fourth side and in contact with the top shielding layer 32B. In certain applications, the first shielding structure and the second shielding structure are both open on opposing sides of the unshielded portion 47A in a direction substantially orthogonal to the top shielding layers.

Figure 9H:
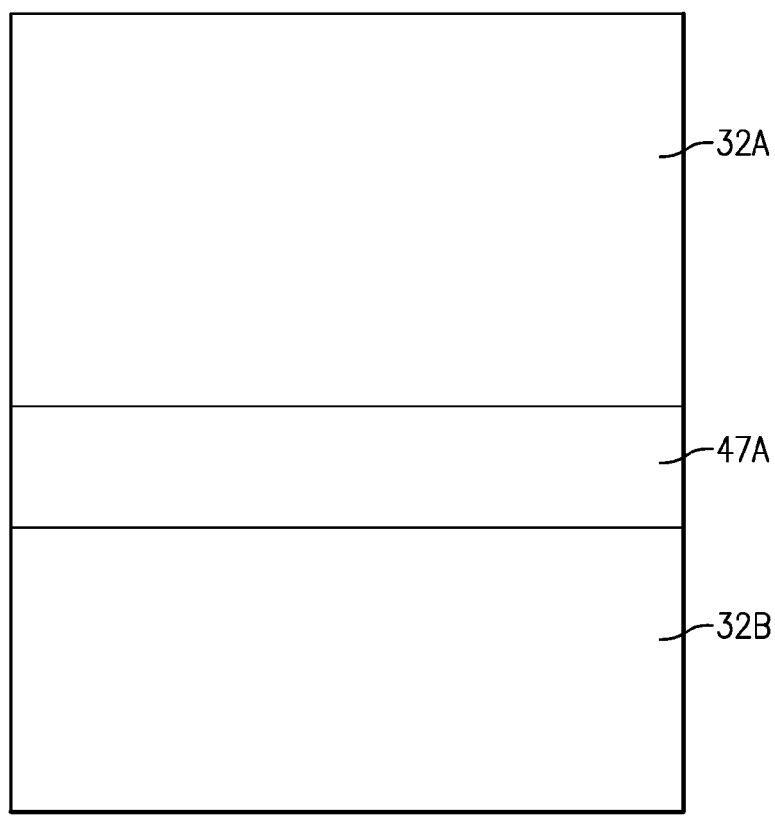
FIG. 9H illustrates an example of a selectively shielded radio frequency module according to an embodiment.

FIG. 9H illustrates a selectively shielded radio frequency module 10G' according to an embodiment. In FIG. 9H, the unshielded portion 47A is wider than in FIG. 9G. The unshielded portion 47A can have a width in a range from about 300 microns to 700 microns, such as about 500 microns. The unshielded portion 47A can have any suitable dimension for a particular application.

FIG. 9I illustrates a selectively shielded radio frequency module 10H' with an unshielded portion 47A between two shielded portions according to an embodiment. The radio frequency module 10H' illustrates that two RF components of the same radio frequency module can shielded by different shielding structures. These RF components can be any suitable RF components, such as RF components operating in different frequency bands (e.g., a high band and a low band). In the radio frequency module 10H', a first shielding structure provides shielding for a first RF component 12-1 and a second shielding structure provides shielding for a second RF component 12-2. The shielding structures of the radio frequency module 10H' can reduce and/or eliminate inference between the first RF component 12-1 and the second RF component 12-2. The first RF component 12-1 is positioned between a top shielding layer 32A of the first shielding structure and a package substrate. The second RF component 12-2 is positioned between a top shielding layer 32B of the second shielding structure and the package substrate.

Conformal layers can form at least three sides of the first shielding structure of the radio frequency module 10H'. Similarly, conformal layers can form at least three sides of the second shielding structure of the radio frequency module 10H'. In certain applications, the first shielding structure and the second shielding structure are both open on opposing sides of the unshielded portion 47A in a direction substantially orthogonal to the top shielding layers. In some instances, one or more conductive features can be disposed between the first RF component 12-1 and the second RF component 12-B. For example, the first shielding structure can include one or more wire bonds disposed between the RF component 12-1 and the unshielded portion 47A, in which the one or more wire bonds are in contact with the top shielding layer 32A. Alternatively or additionally, the second shielding structure can include one or more wire bonds disposed between the RF component 12-2 and the unshielded portion 47A, in which the one or more wire bonds are in contact with the top shielding layer 32B. As another example, the first shielding structure can include a conformal structure disposed between the RF component 12-1 and the unshielded portion 47A and/or the second shielding structure can include a conformal structure disposed between the RF component 12-2 and the unshielded portion 47A. Such a conformal structure can be formed in accordance with any suitable principles and advantages discussed with reference to FIGS. 13A and 13B, for example. In some applications, laser scribing can remove conductive material within a through mold via so that the bottom of the through mold via can correspond to the unshielded portion 47A.

FIG. 9J illustrates a selectively shielded radio frequency module 10I' with an unshielded portion between shielded portions according to an embodiment. The radio frequency module 10F illustrates another example unshielded portion 47B and example RF components 12-1, 12-2A and 12-2B, and 12-3. The unshielded portion 47B can be formed by ablating a conductive material over the module with a laser scribe, for example. As illustrated by FIG. 9J, the unshielded portion 47B can segment a shielding structure into more than two separate shielding structures. The radio frequency module 10I' is an example in which 3 different components are packaged together (SoC 12-1, front end 12-2A and SOC12-2, and crystal 12-3) and are separated from each other by the unshielded portion 47B. In some embodiments, one or more conductive features in contact with a top shielding layer can be on one or both sides of some or all of the unshielded portion 47B. The one or more conductive features can include one or more wire bonds and/or a conformal structure.

Integrated antennas can be printed on a package substrate, for example, as discussed above. In certain embodiments, an integrated antenna can be a multi-layer antenna. For instance, a portion of an integrated antenna can be on a surface of a package substrate and another portion of the integrated antenna can be implemented in another layer above or below the portion of the integrated antenna on the surface of the package substrate. As an example, a portion of an integrated antenna can be printed on a first side of a package substrate and another portion of the integrated antenna can be on a second side of the package substrate, in which the first side opposes the second side. As another example, of an integrated antenna can be printed on a first side of a package substrate and another portion of the integrated antenna can be implemented over a molding layer of a radio frequency module. In some applications, a multi-layer antenna can implement an antenna in a smaller foot print relative to similar a single layer antenna. This can reduce a footprint of the antenna and consequently reduce a footprint of a radio frequency module that includes the antenna.

Figure 10B:
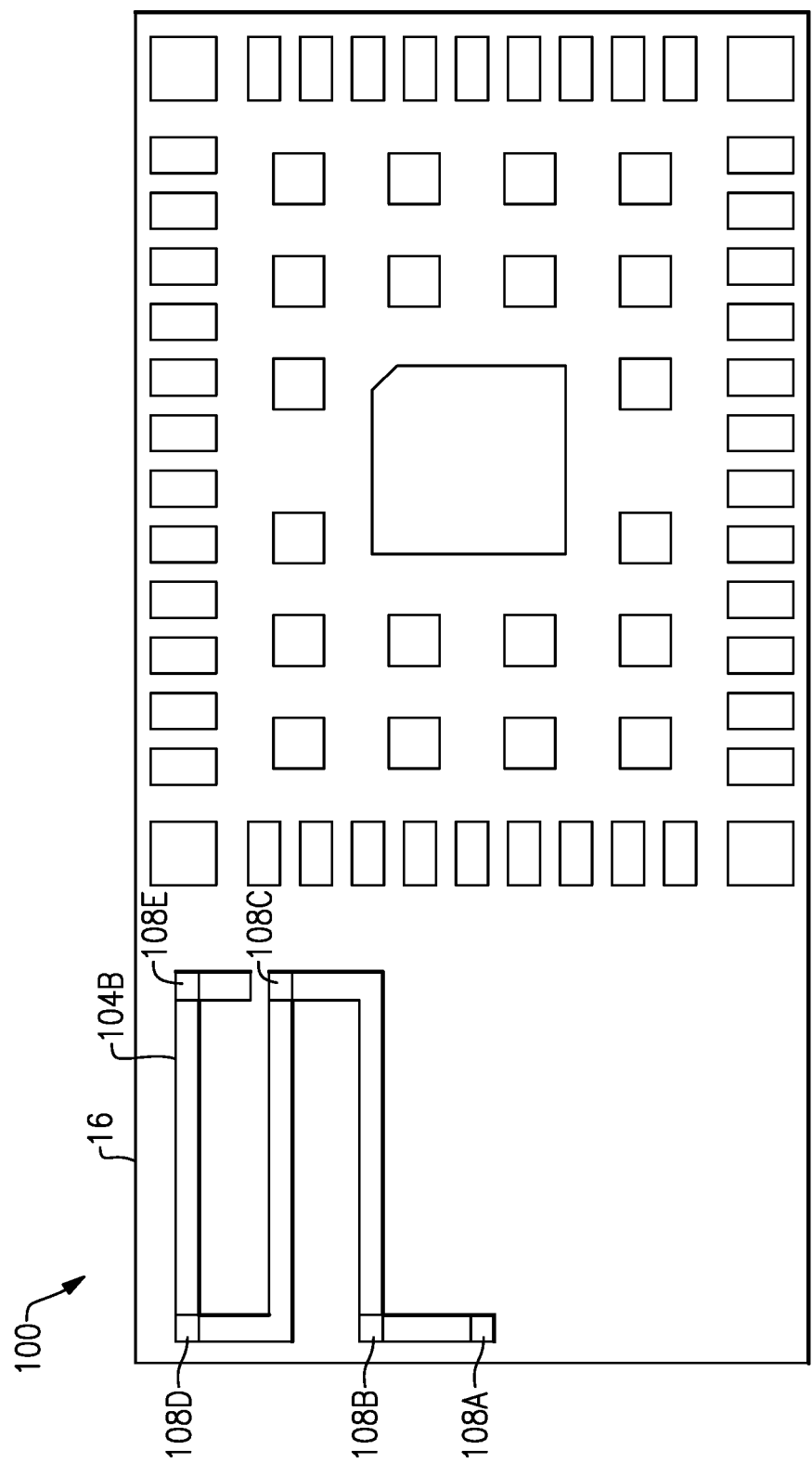

FIGS. 10A and 10B illustrate a radio frequency module 100 that includes an integrated antenna implemented on opposing sides of a package substrate 16. The illustrated integrated antenna is multi-layer antenna. Any suitable principles and advantages of the RF module 100 can be implemented in combination with any of the other embodiments discussed herein. The antenna can include traces on opposing sides of the package substrate. FIG. 10A is a top view of the radio frequency module 100. FIG. 10B is a bottom view of the radio frequency module 100.

As shown in FIG. 10A, a first portion 104A of an antenna can be on a first side of a packaging substrate on which the RF component 12 is also disposed. The first portion 104A can be implemented by a conductive trace. The first portion 104A of the antenna can be electrically connected to a second portion 104B of the antenna by one or more vias that extends through the packaging substrate 16. The first portion 104A and the second portion 104B can together implement the antenna of the RF module 100.

As shown in FIG. 10B, the second portion 104B of the antenna can be on an opposite side of the packaging substrate 16 than the first portion 104A. The second portion 104A can be implemented by a conductive trace. One or more pads can be disposed on the second portion 104A of the antenna. As also shown in FIG. 10B, pads 108A to 108E can be contact with the second portion 104A of the antenna. The pads 108A to 108E can be exposed for providing connections between the antenna and a system board on which the RF module 110 is disposed. The pads 108A to 108E can be soldered to the system board. One or more of the pads 108A to 108E can serve as an anchor point to align the antenna of the RF module 100 with the system board.

Referring back to FIG. 10A, the illustrated RF module 100 includes a matching circuit 106 that is implemented on the packaging substrate 16 external to the shielding structure. The illustrated matching circuit 106 is electrically connected to the antenna. The matching circuit 106 can provide impedance matching associated with the antenna. The matching circuit 106 can include any suitable matching circuit elements, such as one or more capacitors and/or one or more inductors. As illustrated, the matching circuit 106 includes three passive circuit elements 106A, 106B, and 106C. The matching circuit 106 can include more or fewer circuit elements in other applications. For instance, a matching circuit can include two inductors in certain applications. The matching circuit 106 can have a relatively high activity factor. Accordingly, implementing the matching circuit 106 external to the shielding structure can allow heat associated with the matching circuit 106 to dissipate outside of the shielding structure.

Figure 11A:
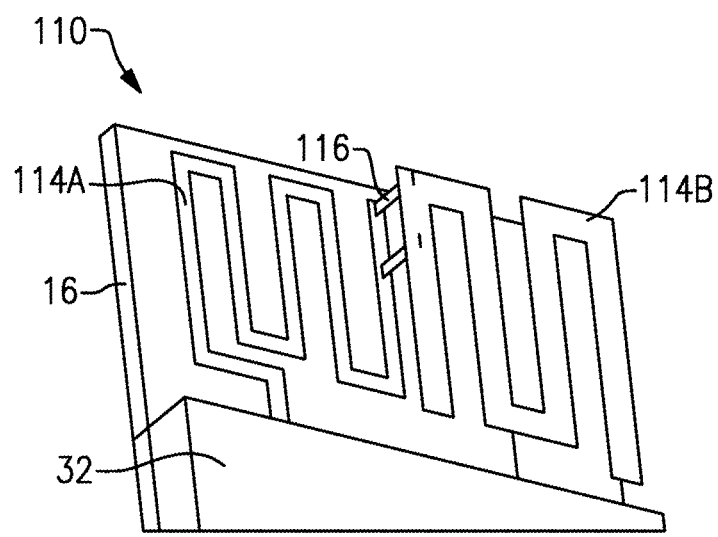
FIG. 11A illustrates a radio frequency module that includes an integrated antenna partially implemented over molding material according to an embodiment.
Figure 11B:
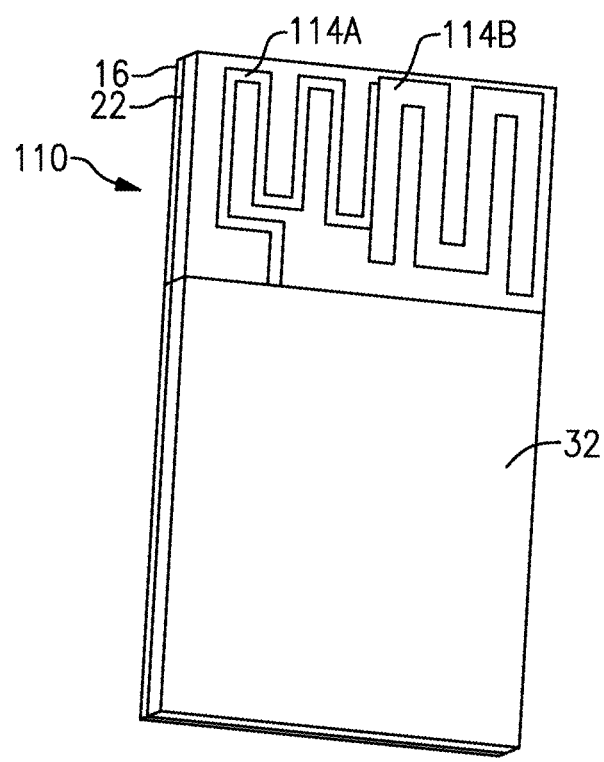
FIG. 11B illustrates another view of the radio frequency module of FIG. 11A.

FIGS. 11A and 11B illustrate a radio frequency module 110 that includes an integrated antenna partially implemented over molding material 22. The illustrated integrated antenna is multi-layer antenna. Any suitable principles and advantages of the RF module 110 can be implemented in combination with any of the other embodiments discussed herein. FIG. 11A shows a partial view of the RF module 110 with molding material omitted for illustrative purposes. FIG. 11B shows a view of the RF module 110 with the molding material 22. In FIGS. 11A and 11B, the antenna includes a first portion 114A and a second portion 114B. The first portion 114A can be a conductive trace on the package substrate 16. The second portion 114B can be disposed over molding material 22 of the RF module 110. The second portion 114B can include patterned conductive material over the molding material 22. The second portion 114B can be implemented by the same material as the shielding layer 32 of a shielding structure of the RF module 110. The second portion 114B can be formed during an operation during which the shielding layer 32 is formed. The second portion 114B of the antenna and the shielding layer 32 can be approximately the same distance from the packaging substrate 16. One or more wire bonds 116 can electrically connect the first portion 114A of the antenna with the second portion of the antenna 114B.

Figure 12:
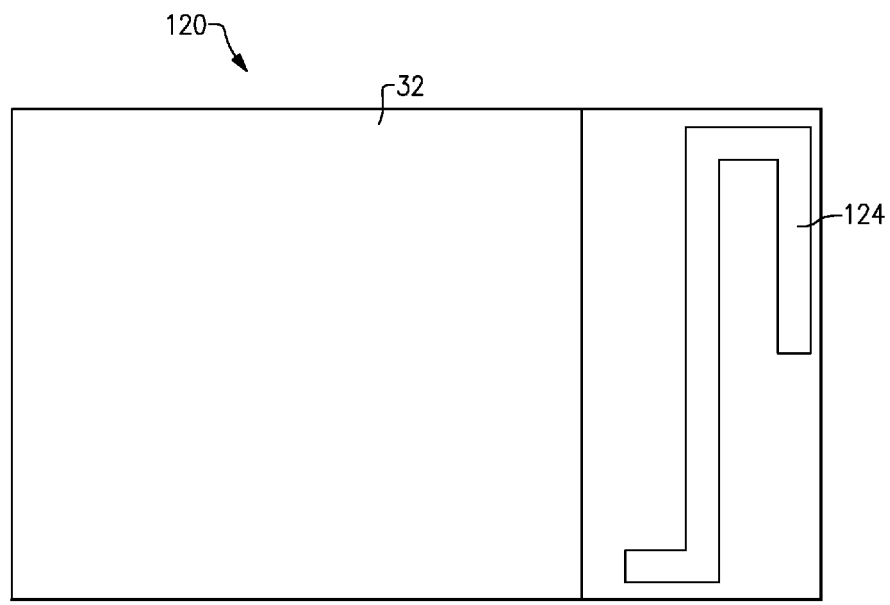
FIG. 12 illustrates an RF module with an integrated antenna shielded from an RF component according to an embodiment.

It can be desirable to reduce the physical size of an RF module with an integrated antenna. Certain antenna designs can reduce the physical size and/or footprint of such an RF module having an integrated antenna. FIG. 12 illustrates an RF module 120 with an integrated antenna 124 shielded from an RF component. Any suitable principles and advantages of the RF module 120 can be implemented in combination with any of the other embodiments discussed herein. With the antenna 124, the RF module 120 can have a length that is reduced about 15% to 20% relative to some other antenna designs. Accordingly, the RF module 120 can have a smaller footprint that such other antenna designs.

Although the RF modules shown in FIGS. 9A to 9E include wire bonds disposed between an RF component and an integrated antenna, other conductive structures can provide shielding between the RF component and the integrated antenna in certain embodiments. For example, a conductive conformal structure can provide such shielding. Accordingly, a conductive conformal structure can be disposed between an RF component and an integrated antenna in an RF module in accordance with any suitable principles and advantages discussed herein.

Any of the processes of forming a shielding layer over a radio frequency component of a module and leaving an antenna unshielded discussed herein can be modified to form such a conformal layer. For example, a through mold via can be formed through molding material of a molding structure of an RF module. Laser scribing can remove the molding material to form such a through mold via. Then a conductive layer can be formed over the RF module by sputtering or any other suitable manner. This can form a conductive layer over the molding material and within the through mold via, including along a sidewall of the through mold via. The conductive layer can then be removed over the integrated antenna such that the antenna of the RF module is unshielded over the packaging substrate. Such removal can be performed in accordance with any suitable principles and advantages discussed herein, such as laser removal of conductive material over the antenna and/or removing masking material over the antenna. After removing the conductive layer over the antenna, a conductive conformal structure can remain within the through mold via. This conductive conformal structure can be in contact with the shielding layer over the RF component and be included in the shielding structure around the RF component. Accordingly, this conductive conformal structure can provide shielding between the RF component and the antenna of the RF module.

Figure 13A:
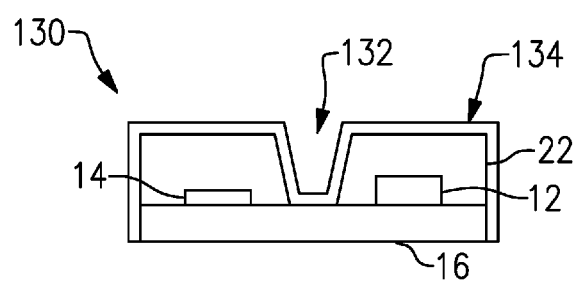
FIG. 13A illustrates an RF module with a through mold via according to an embodiment.

FIG. 13A illustrates an RF module 130 with a through mold via 132. The through mold via 132 can be formed by laser scribing, for example. The through mold via 132 can have one or more sloped sidewalls. As illustrated, the through mold via 132 is disposed between RF component 12 and the antenna 14. The RF module 130 includes a conductive layer 134 over molding material 22. The conductive layer 134 is also formed over the sloped sidewalls of the through mold via 132. The sloped sidewalls of the through mold via 132 can enable a conductive conformal structure between the RF component 12 and the antenna 14 to be formed when the conductive layer is formed over the RF component 12. With sloped sidewalls, a conductive conformal structure can be formed with desirable step coverage between the antenna 14 and RF component 12.

Figure 13B:
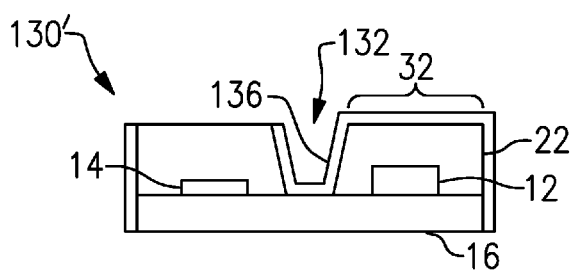
FIG. 13B illustrates an RF module after the conductive layer shown in FIG. 13A is removed over an antenna according to an embodiment.

FIG. 13B illustrates an RF module 130' after the conductive layer 134 shown in FIG. 13A is removed over an antenna 14. In the RF module 130', a shielding structure around the RF component 12 includes the shielding layer 32 and a conductive conformal structure 136 over a sidewall of the through mold via 132. The conductive conformal structure 136 is arranged to provide shielding between the RF component 12 and the antenna 14. Other sides of the RF component 12 can also be shielded by a conductive conformal structure. For instance, the RF component 12 of the RF module 130' can be surrounded by a conductive conformal structure.

Figure 14A:
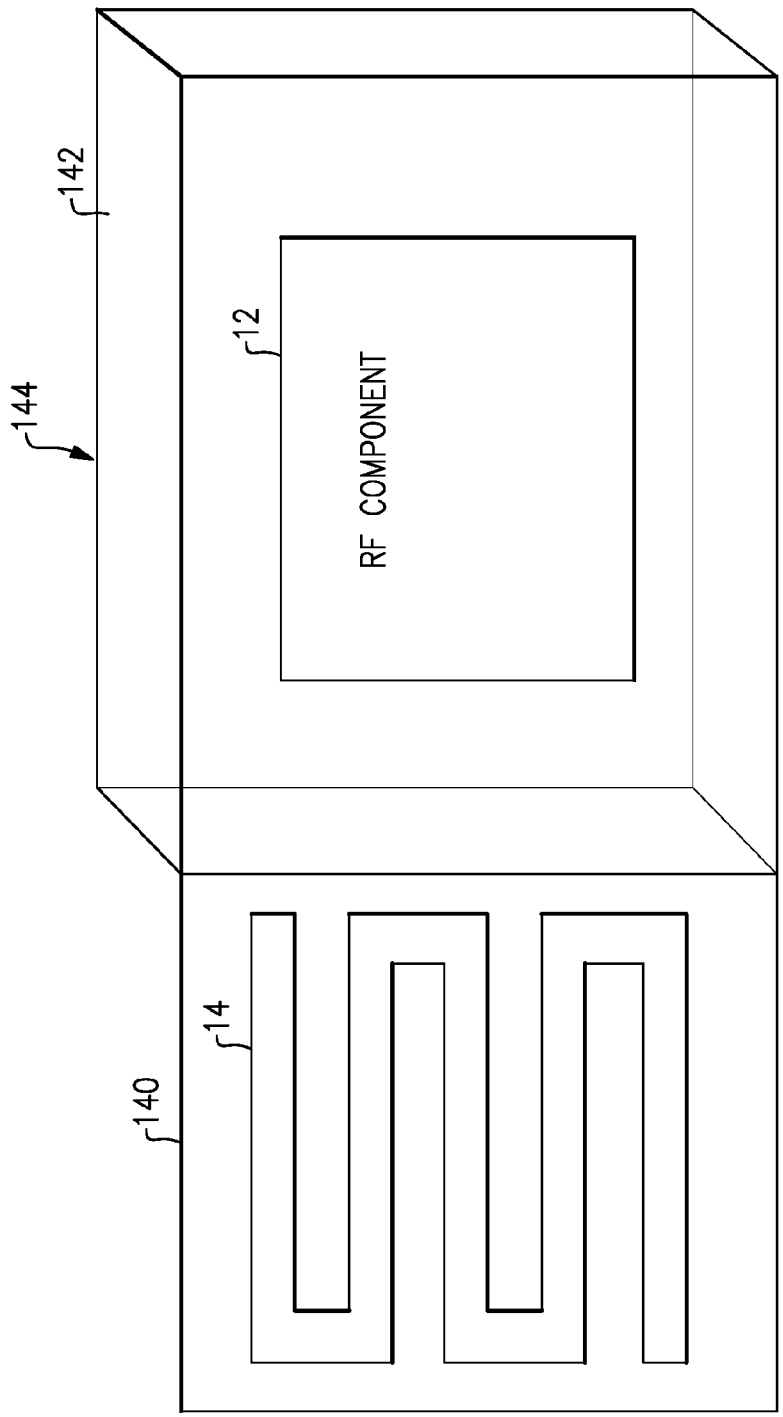
FIG. 14A is a top view of a shielded RF component on a carrier with a printed antenna according to an embodiment.
Figure 14B:
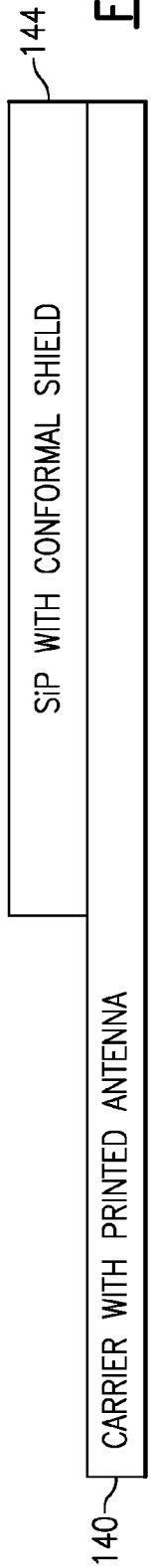
FIG. 14B is a side view of the shielded RF component on the carrier with the printed antenna.

FIGS. 14A and 14B are diagrams of a shielded RF component on a carrier with a printed antenna according to an embodiment. FIG. 14A is a top view and FIG. 14B is a side view. As shown in FIGS. 14A and 14B, a carrier 140 can have an antenna 14 printed thereon. The carrier 140 can be a package substrate, such as a laminate substrate. The carrier 140 can have fewer layers compared to the package substrates 16 discussed above. For example, in certain applications, the carrier 140 can include two layers and the package substrate 16 can include four layers. An RF component 12 can be shielded by a shielding structure 142, which can be a conformal shielding structure as illustrated. A packaged component 144 can be disposed on the carrier 140 laterally from the antenna 14. Accordingly, the antenna 14 can transmit and/or receive signals without the shielding structure 142 interfering. The packaged component 144 can be disposed on the carrier 140 such that a ground pad on the carrier 140 is electrically connected to the conformal shielding structure. The packaged component 144 can include a system in a package with a conformal shielding structure. The packaged component 144 can include molded system in a package with its own package substrate.

Figure 15A:
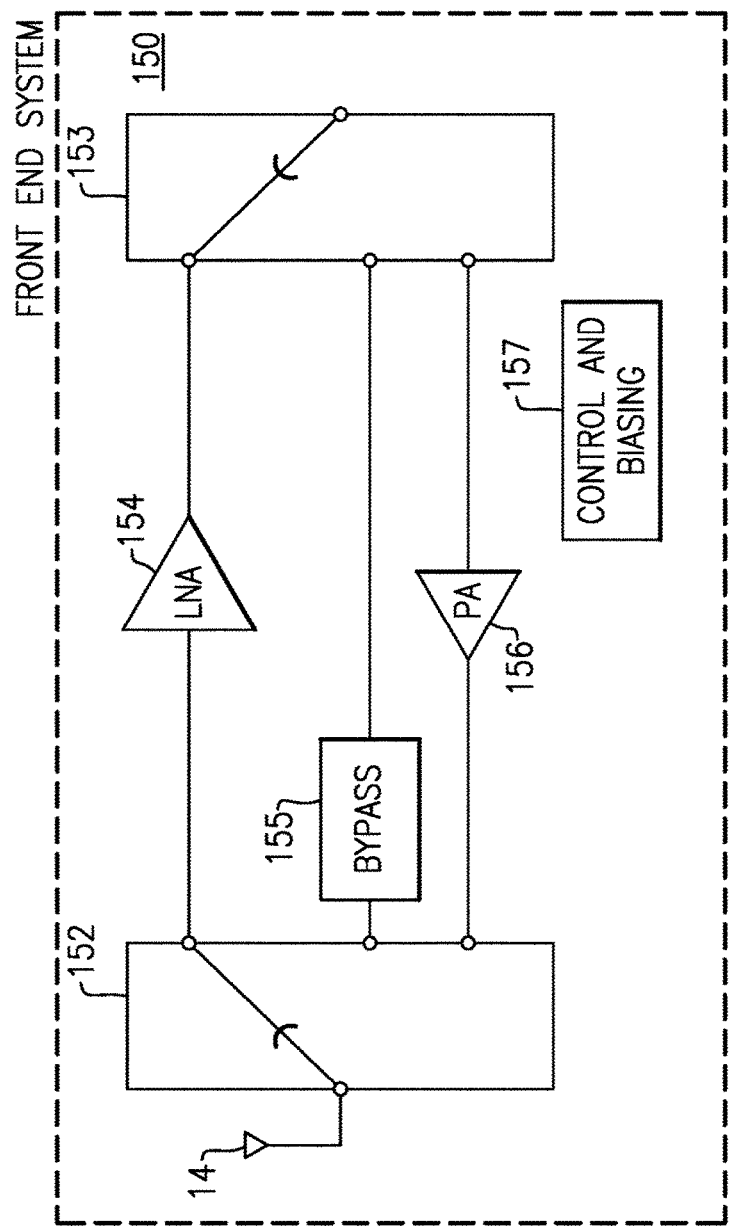
FIG. 15A is a schematic block diagram of front end system according to an embodiment.
Figure 15B:
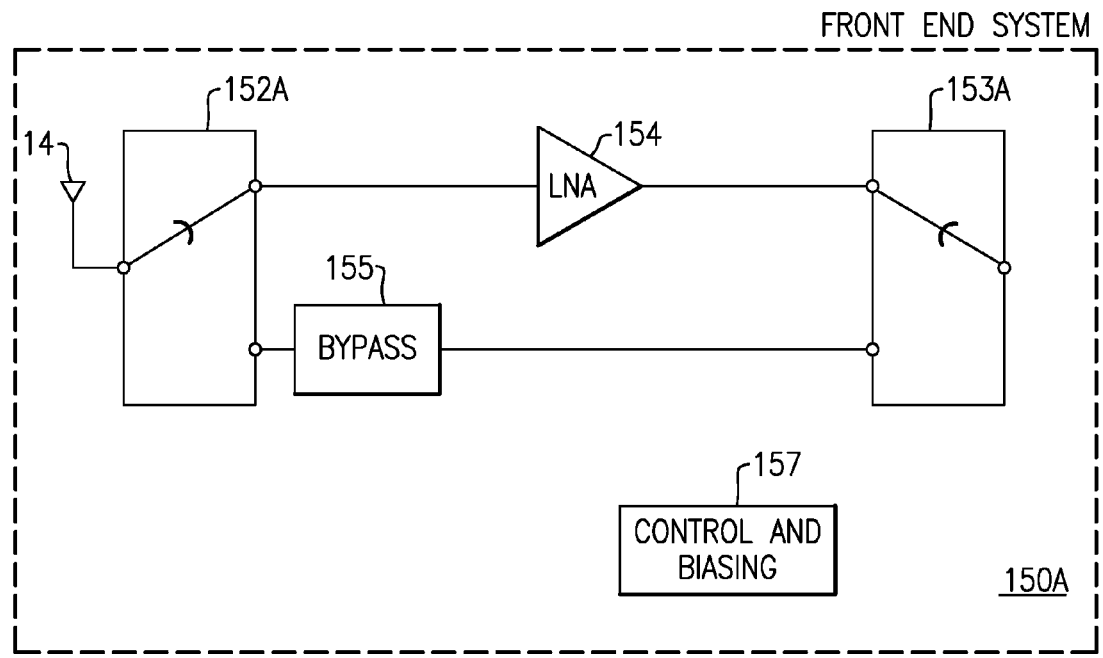
FIG. 15B is a schematic block diagram of front end system according to another embodiment.
Figure 15C:
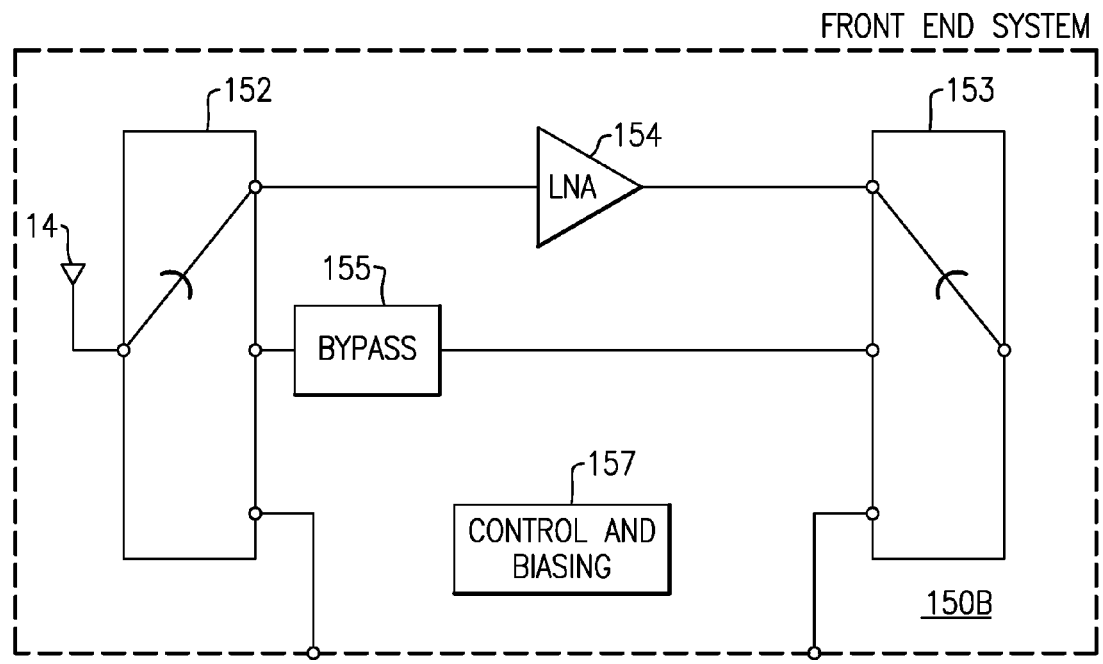
FIG. 15C is a schematic block diagram of front end system according to another embodiment.

FIGS. 15A, 15B, and 15C are schematic block diagrams of front end systems according to certain embodiments. An RF front end can include circuits in a signal path between an antenna and a baseband system. Some RF front ends can include circuits in signal paths between one or more antennas and a mixer configured to module a signal to RF or to demodulate an RF signal. RF components discussed above can include a front end system or a portion of a front end system.

The front end systems of FIGS. 15A, 15B, and 15C can be implemented by packaged modules. Some packaged modules that include a front end system, such as any of the illustrated front end systems, can be multi-chip modules and/or include other circuitry. Packaged modules that include a front end system can be referred to as front end modules. Some front end modules can include a front end integrated circuit and other components, such as a crystal and/or a system on a chip, within a common shielding structure. A front end module is an example of an RF module. Front end modules can include relatively low cost laminate based front end modules that combine low noise amplifiers with power noise amplifiers and/or RF switches in certain implementations. In the systems of FIGS. 15A, 15B, and 15C, an antenna is integrated with the RF front end in a front end module. The front end modules can be implemented in accordance with any of the principles and advantages discussed herein. Front end circuits can be disposed on a package substrate and surrounded by a shielding structure. An antenna can be on the package substrate outside of the shielding structure. A front end module with an integrated antenna can be an antenna in a package system.

FIG. 15A is a schematic block diagram of an RF front end system 150 according to an embodiment. The RF front end system 150 is configured to receive RF signals from the antenna 14 and to transmit RF signals by way of the antenna 14. The antenna 14 can be implemented in accordance with any of the principles and advantages discussed herein. The illustrated front end system 150 includes a first multi-throw switch 152, a second multi-throw switch 153, a receive signal path that includes a low noise amplifier (LNA) 154, a bypass signal path that includes a bypass network 155, a transmit signal path that includes a power amplifier 156, and a control and biasing circuit 157. The low noise amplifier 154 can be any suitable low noise amplifier. The bypass network 155 can include any suitable network for matching and/or bypassing the receive signal path and the transmit signal path. The bypass network 155 can be implemented by a passive impedance network and/or by a conductive trace or wire. The power amplifier 156 can be implemented by any suitable power amplifier. The LNA 154, the switches 152 and 153, and the power amplifier 156 can be shielded from the antenna 14 by wire bonds of a shielding structure in accordance with any of the principles and advantages discussed herein. The shielding structure can include a shielding layer over the LNA 154, the switches 152 and 153, and the power amplifier 156. The shielding layer can leave the antenna 14 unshielded. The shielding layer can be implemented in accordance with any of the principles and advantages discussed herein.

The first multi-throw switch 152 can selectively electrically connect a particular signal path to the antenna 14. The first multi-throw switch 152 can electrically connect the receive signal path to the antenna 14 in a first state, electrically connect the bypass signal path to the antenna 14 in a second state, and electrically connect the transmit signal to the antenna 14 in a third state. The second multi-throw switch 153 can selectively electrically connect a particular signal path to an input/output port of the front end system 150, in which the particular signal path is the same signal path electrically connected to the antenna 14 by way of the first multi-throw switch 152. Accordingly, second multi-throw switch 153 together with the first multi-throw switch 152 can provide a signal path between the antenna 14 and an input/output port of the front end system 150. A system on a chip (SOC) can be electrically connected to the input/output port of the front end system 150.

The control and biasing circuit 157 can provide any suitable biasing and control signals to the other circuits of the front end system 150. For example, the control and biasing circuit 157 can provide bias signals to the LNA 154 and/or the power amplifier 156. Alternatively or additionally, the control and biasing circuit 157 can provide control signals to the multi-throw switches 152 and 153 to set the state of these switches.

FIG. 15B is a schematic block diagram of an RF front end system 150A according to an embodiment. The RF front end system 150A of FIG. 15B is similar to the RF front end system 150 of FIG. 15A, except that a transmit signal path is omitted and the multi-throw switches 152A and 153A each have one fewer throw that the multi-throw switches 152 and 153. The illustrated front end system 150A includes a receive signal path and a bypass signal path and does not include a transmit signal path.

FIG. 15C is a schematic block diagram of an RF front end system 150B according to an embodiment. The RF front end system 150B of FIG. 15C is like the RF front end system 150 of FIG. 15A, except that a power amplifier of the transmit signal path is omitted from the RF front end system 150B. The RF front end system 150B includes input/output ports for coupling to a respective throw of each of the multi-throw switches 152 and 153. A power amplifier external to the front end system 150B can be electrically connected between these input/output ports such that the power amplifier is included in the transmit signal path between the multi-throw switches 152 and 153. The power amplifier can be included within a common shielding structure as the elements of the RF front end system 150B illustrated in FIG. 15C and in a different die than the elements of the RF front end system 150B illustrated in FIG. 15C. In some instances, the power amplifier can be implemented in a different packaged module than the elements of the RF front end system 150B illustrated in FIG. 15C.

Figure 16A:
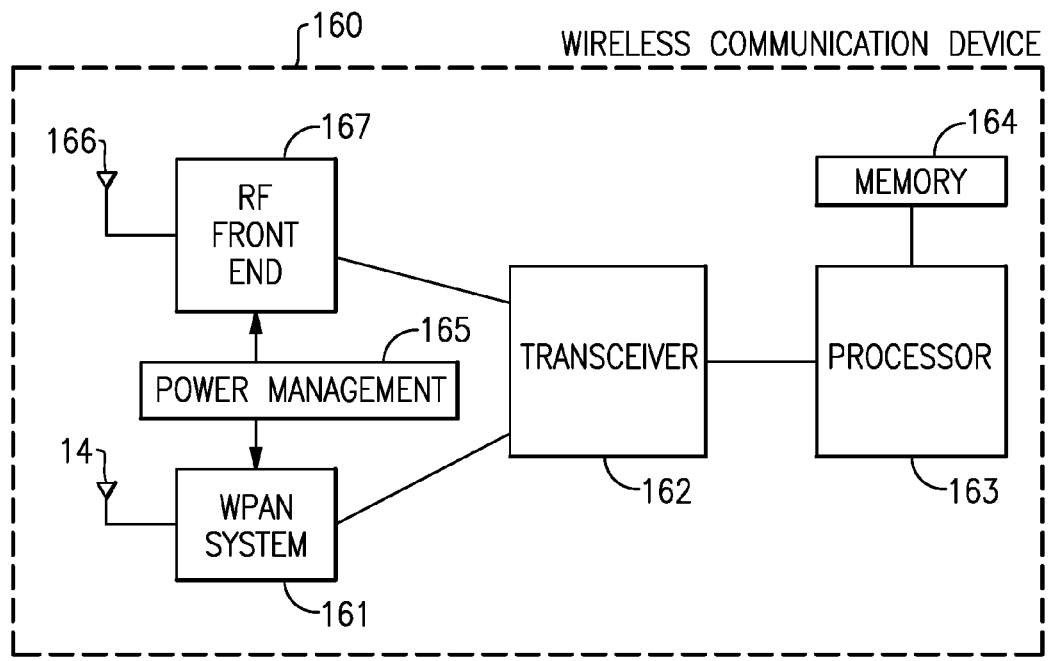
FIG. 16A is a schematic block diagram of an illustrative wireless communication device that includes a module with an integrated antenna in accordance with one or more embodiments.
Figure 16B:
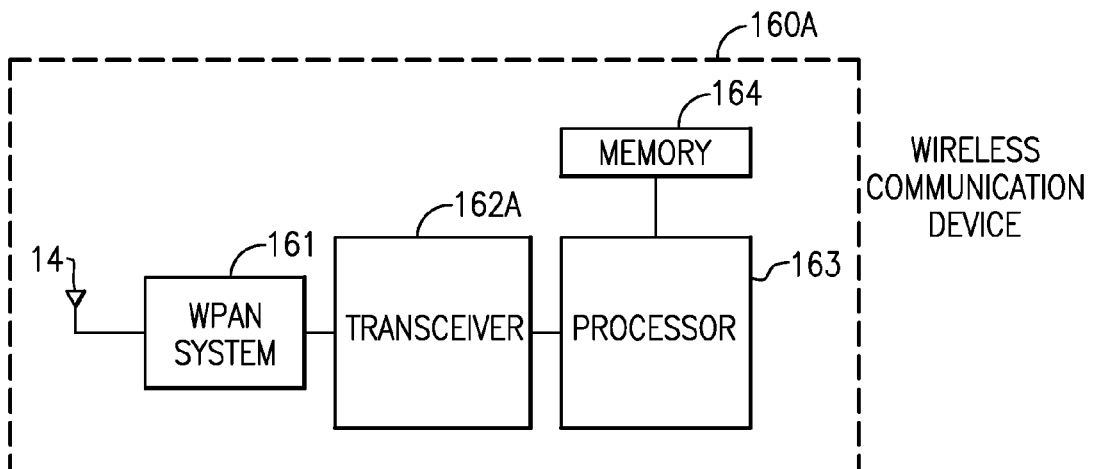
FIG. 16B is a schematic block diagram of another illustrative wireless communication device that includes a module with an integrated antenna in accordance with one or more embodiments.

FIGS. 16A and 16B are schematic block diagrams of illustrative wireless communication devices that include partially shielded RF modules in accordance with one or more embodiments. The wireless communication device 160 can be any suitable wireless communication device. For instance, this device can be a mobile phone such as a smart phone. As illustrated, the wireless communication device 160 includes a first antenna 14, a wireless personal area network (WPAN) system 161, a transceiver 162, a processor 163, a memory 164, a power management block 165, a second antenna 166, and an RF front end system 167. Any of the RF modules discussed herein can include or be included in the WPAN system 161. For instance, an RF module can include a shielding layer over some or all of the WPAN system 161 and the antenna 14 can be unshielded. The WPAN system 161 is an RF front end system configured for processing RF signals associated with personal area networks (PANs). The WPAN system 161 can be configured to transmit and receive signals associated with one or more WPAN communication standards, such as signals associated with one or more of Bluetooth, ZigBee, Z-Wave, Wireless USB, INSTEON, IrDA, or Body Area Network. In another embodiment, a wireless communication device can include a wireless local area network (WLAN) system in place of the illustrated WPAN system, and the WLAN system can process wireless local area network signals, such as Wi-Fi signals. The RF front end system 167 can be implemented in accordance with any of the principles and advantages related to partially shielded modules discussed herein in certain applications.

The illustrated wireless communication device 160A of FIG. 16B is a device configured to communicate over a WPAN. This wireless communication device 160A can be relatively less complex than the wireless communication device 160 of FIG. 16A. As illustrated, the wireless communication device 160A includes an antenna 14, a WPAN system 161, a transceiver 162A, a processor 163, and a memory 164. The WPAN system 161 can be implemented in accordance with any of the principles and advantages related to partially shielded modules discussed herein. An RF module can include the WPAN system 161 on a package substrate and the antenna 14 on the package substrate. In another embodiment, a wireless communication device can include a wireless local area network (WLAN) system in place of the WPAN system 161 illustrated in FIG. 16B, and the WLAN system can process wireless local area network signals, such as Wi-Fi signals.

Some of the embodiments described above have provided examples in connection with RF components, front end system and/or wireless communications devices. However, the principles and advantages of the embodiments can be used for any other systems or apparatus that could benefit from any of the selective shielding techniques, shielding structures, integrated antennas, circuits, or any combination thereof described herein. Although described in the context of RF circuits, one or more features described herein can also be utilized in packaging applications involving non-RF components. Similarly, one or more features described herein can also be utilized in packaging applications without electromagnetic isolation functionality. Moreover, while embodiments discussed herein include an RF shielding structure and an antenna external to the shielding structure, other electronic components can be on a package substrate of a module and external to a RF shielding structure on the package substrate instead of or in addition to an antenna. The principles and advantages discussed herein can be applied to two or more shielding structures around electronic components on a packaging substrate and an antenna on the packaging substrate that is external to each of the two or more shielding structures. Any of the principles and advantages of the embodiments discussed can be used in any other systems or apparatus that could benefit from any of the selective shielding features discussed herein.

The various features and processes described herein may be implemented independently of one another, or may be combined in various ways. All possible combinations and sub combinations are intended to fall within the scope of this disclosure. In addition, certain method or process blocks may be omitted in some implementations. The methods and processes disclosed herein are also not limited to any particular sequence, and the blocks or states relating thereto can be performed in any other sequences that are appropriate. For example, described blocks or states may be performed in an order other than that specifically disclosed, or multiple blocks or states may be combined in a single block or state. The example blocks or states may be performed in serial, in parallel, or in some other manner as appropriate. Blocks or states may be added to or removed from the disclosed example embodiments as suitable. The example systems and components described herein may be configured differently than described. For example, elements may be added to, removed from, or rearranged compared to the disclosed example embodiments. Various embodiments can apply different techniques for fabricating different types of electronic devices.

Aspects of this disclosure can be implemented in various electronic devices. Examples of the electronic devices can include, but are not limited to, consumer electronic products, parts of the consumer electronic products or other electronic products such as packaged modules and/or system board assemblies, electronic test equipment, cellular communications infrastructure such as a base station, etc. Examples of the electronic devices can include, but are not limited to, a mobile phone such as a smart phone, a wearable computing device such as a smart watch or an ear piece, an Internet of Things (IoT) device, a telephone, a television, a computer monitor, a computer, a modem, a hand-held computer, a laptop computer, a tablet computer, a personal digital assistant (PDA), a microwave, a refrigerator, a vehicular electronics system such as an automotive electronics system, a stereo system, a DVD player, a CD player, a digital music player such as an MP3 player, a radio, a camcorder, a camera such as a digital camera, a portable memory chip, a washer, a dryer, a washer/dryer, peripheral device, a clock, etc. Further, the electronic devices can include unfinished products.

Unless the context clearly requires otherwise, throughout the description and the claims, the words "comprise," "comprising," "include," "including," and the like are generally to be construed in an inclusive sense, as opposed to an exclusive or exhaustive sense; that is to say, in the sense of "including, but not limited to." The word "coupled," as generally used herein, refers to two or more elements that may be either directly connected, or connected by way of one or more intermediate elements. Likewise, the word "connected," as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description of Certain Embodiments using the singular or plural number may also include the plural or singular number, respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or whether these features, elements and/or states are included or are to be performed in any particular embodiment.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. A packaged radio frequency module comprising:
a package substrate;
a radio frequency component on the package substrate;
a multi-layer antenna including a first portion and a second portion, the first portion being in a different layer than the second portion, and the first portion being electrically connected to the second portion; and
a radio frequency shielding structure configured to provide shielding between the multi-layer antenna and the radio frequency component.

2. The packaged radio frequency module of claim 1 wherein the first portion of the multi-layer antenna includes a first conductive trace on a first side of the package substrate, and the second portion of the multi-layer antenna includes a second conductive trace on a second side of the package substrate, the first side opposing the second side.

3. The packaged radio frequency module of claim 2 further comprising a via in the package substrate, the first conductive trace being connected to the second conductive trace by way of the via.

4. The packaged radio frequency module of claim 2 further comprising a pad on the second conductive trace, the pad being configured for connecting to a system board.

5. The packaged radio frequency module of claim 1 wherein the first portion of the multi-layer antenna is on a first side of the package substrate and the second portion of the multi-layer antenna is on a second side of the package substrate, the first side opposing the second side.

6. The packaged radio frequency module of claim 1 wherein first portion of the multi-layer antenna and the second portion of the multi-layer antenna are implemented on the same side of the package substrate.

7. The packaged radio frequency module of claim 1 wherein the first portion of the multi-layer antenna includes a trace on the package substrate, and the second portion of the multi-layer antenna includes a patterned conductive material over a molding material.

8. The package radio frequency module of claim 7 wherein the trace is electrically connected to the patterned conductive material by a wire bond.

9. The package radio frequency module of claim 7 wherein the radio frequency shielding structure includes a shielding layer over the radio frequency component, the shielding layer being substantially the same distance from the package substrate as the patterned conductive material of the multi-layer antenna.

10. The packaged radio frequency module of claim 1 further comprising a matching circuit coupled to the multi-layer antenna, the matching circuit including a passive impedance element that is external to the radio frequency shielding structure.

11. The packaged radio frequency module of claim 1 wherein the multi-layer antenna is a folded monopole antenna.

12. The packaged radio frequency module of claim 1 wherein the radio frequency component includes a front end integrated circuit, a crystal, and a system on a chip.

13. The packaged radio frequency module of claim 1 wherein the radio frequency shielding structure includes a wire bond disposed between the multi-layer antenna and the radio frequency component.

14. The packaged radio frequency module of claim 1 wherein the radio frequency shielding structure includes a conductive conformal structure disposed between the multi-layer antenna and the radio frequency component.

15. The packaged radio frequency module of claim 14 further comprising a through mold via having a sloped sidewall and the conductive conformal structure is over the sloped sidewall.

16. A system board assembly comprising:
a packaged component including a radio frequency component on a package substrate, a multi-layer antenna, and a radio frequency shielding structure around the radio frequency component and configured to provide shielding between the radio frequency component and the multi-layer antenna; and
a system board on which the packaged component is disposed, the system board including ground pads electrically connected to the radio frequency shielding structure.

17. The system board assembly of claim 16 wherein the multi-layer antenna includes a first trace on a first side of the package substrate and a second trace on a second side of the package substrate, the first side opposing the second side.

18. The system board assembly of claim 17 further comprising a pad on the second trace soldered to another pad on the system board.

19. A wireless communication device comprising:
a packaged radio frequency module including a radio frequency component on a package substrate, a multi-layer antenna including two portions in different layers and electrically connected to each other, and a radio frequency shielding structure that includes a conductive feature disposed between the radio frequency component and the multi-layer antenna, and
a transceiver in communication with the radio frequency component.

20. The wireless communication device of claim 19 wherein the radio frequency component is configured to provide at least one of a wireless personal area network signal or a wireless local area network signal to the multi-layer antenna.

* * * * *